US008653354B1

(12) United States Patent
Van Buskirk

(10) Patent No.: US 8,653,354 B1
(45) Date of Patent: Feb. 18, 2014

(54) AUDIO SYNTHESIZING SYSTEMS AND METHODS

(75) Inventor: James Van Buskirk, Austin, TX (US)

(73) Assignee: Sonivoz, L.P., Cumberland, RI (US)

( * ) Notice: Subject to any disclaimer, the term of this patent is extended or adjusted under 35 U.S.C. 154(b) by 12 days.

(21) Appl. No.: 13/196,690

(22) Filed: Aug. 2, 2011

(51) Int. Cl.
*G10H 1/12* (2006.01)
*H03H 7/01* (2006.01)

(52) U.S. Cl.
USPC .................. 84/661; 84/609; 84/622; 84/649; 84/659

(58) Field of Classification Search
None
See application file for complete search history.

(56) References Cited

U.S. PATENT DOCUMENTS

| | | | | |
|---|---|---|---|---|
| 4,185,531 | A | 1/1980 | Oberheim et al. | |
| 4,649,783 | A | 3/1987 | Strong et al. | |
| 4,988,960 | A | 1/1991 | Tomisawa | |
| 5,524,057 | A * | 6/1996 | Akiho et al. | 381/94.7 |
| 5,684,260 | A | 11/1997 | Van Buskirk | |
| 5,811,706 | A | 9/1998 | VanBuskirk et al. | |
| 5,841,387 | A | 11/1998 | VanBuskirk | |
| 5,890,125 | A * | 3/1999 | Davis et al. | 704/501 |
| 5,917,919 | A * | 6/1999 | Rosenthal | 381/71.11 |
| 6,008,446 | A | 12/1999 | VanBuskirk et al. | |
| 6,104,822 | A * | 8/2000 | Melanson et al. | 381/320 |
| 7,110,554 | B2 * | 9/2006 | Brennan et al. | 381/94.7 |
| 7,359,520 | B2 * | 4/2008 | Brennan et al. | 381/92 |
| 2003/0063759 | A1 * | 4/2003 | Brennan et al. | 381/92 |
| 2003/0108214 | A1 * | 6/2003 | Brennan et al. | 381/94.7 |
| 2004/0131203 | A1 * | 7/2004 | Liljeryd et al. | 381/98 |
| 2005/0111683 | A1 * | 5/2005 | Chabries et al. | 381/317 |
| 2005/0132870 | A1 * | 6/2005 | Sakurai et al. | 84/612 |
| 2008/0260175 | A1 * | 10/2008 | Elko | 381/73.1 |
| 2008/0304676 | A1 * | 12/2008 | Alves et al. | 381/66 |
| 2009/0220100 | A1 * | 9/2009 | Ohta et al. | 381/63 |
| 2009/0323976 | A1 * | 12/2009 | Asada et al. | 381/71.1 |
| 2010/0124341 | A1 * | 5/2010 | Kano | 381/94.1 |
| 2012/0099732 | A1 * | 4/2012 | Visser | 381/17 |
| 2012/0128177 | A1 * | 5/2012 | Truman et al. | 381/94.3 |
| 2012/0166187 | A1 * | 6/2012 | Van Buskirk et al. | 704/207 |
| 2012/0288124 | A1 * | 11/2012 | Fejzo et al. | 381/303 |

OTHER PUBLICATIONS

Karplus and Strong, Digital Synthesis of Plucked-String and Drum Timbres, Computer Music Journal, vol. 7, No. 2 (Summer 1983) pp. 43-55, The MIT Press.

Jaffe and Smith, Extensions of the Karplus-Strong Plucked-String Algorithm, Computer Music Journal, vol. 7, No. 2 (Summer 1983) pp. 56-69, The MIT Press.

* cited by examiner

*Primary Examiner* — Marlon Flectcher

(74) *Attorney, Agent, or Firm* — Finnegan, Henderson, Farabow, Garrett & Dunner, LLP

(57) ABSTRACT

A system and method is disclosed teach how to synthesizing audio. It allows specification of a musical sound to be generated. It synthesizes an audio source, such as noise, using parameters to specify the desired frequency slit spacing and the desired noise-to-frequency band ratio, then filtering the audio source through a sequence of filters to obtain the desired frequency slit spacing and noise to frequency band ratio. It allows modulation of the filters in the sequence. It outputs musical sound.

24 Claims, 26 Drawing Sheets

EXAMPLE: c0= 0.998, b1= -1.0, c1= 0.0001, b2= -0.0001

AUDIO SYNTHESIZING SYSTEMS AND METHODS

FIELD OF INVENTION

Embodiments of the invention are generally related to music, audio, and other sound processing and synthesis, and are particularly related to a system and method for audio synthesis.

SUMMARY

Disclosed herein is a system and method for audio synthesizer utilizing frequency aperture cells (FAC) and frequency aperture arrays (FAA). In accordance with an embodiment, an audio processing system can be provided for the transformation of audio-band frequencies for musical and other purposes. In accordance with an embodiment, a single stream of mono, stereo, or multi-channel monophonic audio can be transformed into polyphonic music, based on a desired target musical note or set of multiple notes. The system utilizes an input waveform(s) (which can be either file-based or streamed) which is then fed into an array of filters, which are themselves optionally modulated, to generate a new synthesized audio output.

Previous techniques for dealing with both pitched and non-pitched audio input is known as subtractive synthesis, whereby single or multi-pole High Pass, Low Pass, Band Pass, Resonant and non-resonant filters are used to subtract certain unwanted portions from the incoming sound. In this technique, the subtractive filters usually modify the perceived timbre of the note, however the filter process does not determine the perceived pitch, except in the unusual case of extreme filter resonance. These filters are usually of type IIR, Infinite Impulse Response, indicating a delay line and a feedback path. Others who have employed noise routed through IIR filters are Kevin Karplus, Alex Strong (1983). "Digital Synthesis of Plucked String and Drum Timbres". Computer Music Journal (MIT Press) 7 (2): 43-55. doi:10.2307/3680062, incorporated herein by reference. Although arguably also subtractive, in these previous techniques the resonance of the filter usually determines the pitch as well as it affects the timbre. There have been various improvements to these previous techniques, whereby certain filter designs are intended to emulate certain portions of their acoustic counterparts.

Compared to additive synthesis, the present invention allow for greater computational efficiency and facilitation of the synthesis of noise sound components as they combine and modulate in complex ways. By synthesizing groups of harmonic and inharmonic related frequencies, rather than individually synthesizing each individual frequency partial, significant computational efficiencies can be gained, and more cost effective systems can be built. Additive synthesis does not have the ability to produce realistic noise components nor has it the ability for complex noise interactions, as is desirable for many types of musical sounds.

Advantages of various embodiments of the present invention over previous techniques include that the input audio source can be completely unpitched and unmusical, even consisting of just pure white noise or a person's whisper, and after being synthesized by the FAA have the ability to be completely musical, with easily recognized pitch and timbre components; and the use of a real-time streamed audio input to generate the input source which is to be synthesized. The frequency aperture synthesis approach allows for both file-based audio sources and real-time streamed input. The result is a completely new sound with unlimited scope because the input source itself has unlimited scope. In accordance with an embodiment, the system also allows multiple synthesis to be combined to create unique hybrid sounds, or accept input from a musical keyboard, as an additional input source to the FAA filters. Other features and advantages will be evident from the following description.

Appendix A lists sets of parameters and other pre-sets to produce various example timbres in accordance with an embodiment.

DETAILED DESCRIPTION

Disclosed herein is a system and method for audio synthesizer utilizing frequency aperture cells (FAC) and frequency aperture arrays (FAA). In accordance with an embodiment, an audio processing system can be provided for the transformation of audio-band frequencies for musical and other purposes. In accordance with an embodiment, a single stream of mono, stereo, or multi-channel monophonic audio can be transformed into polyphonic music, based on a desired target musical note or set of multiple notes. At its core, the system utilizes an input waveform(s) (which can be either file-based or streamed) which is then fed into an array of filters, which are themselves optionally modulated, to generate a new synthesized audio output.

Figure 1:
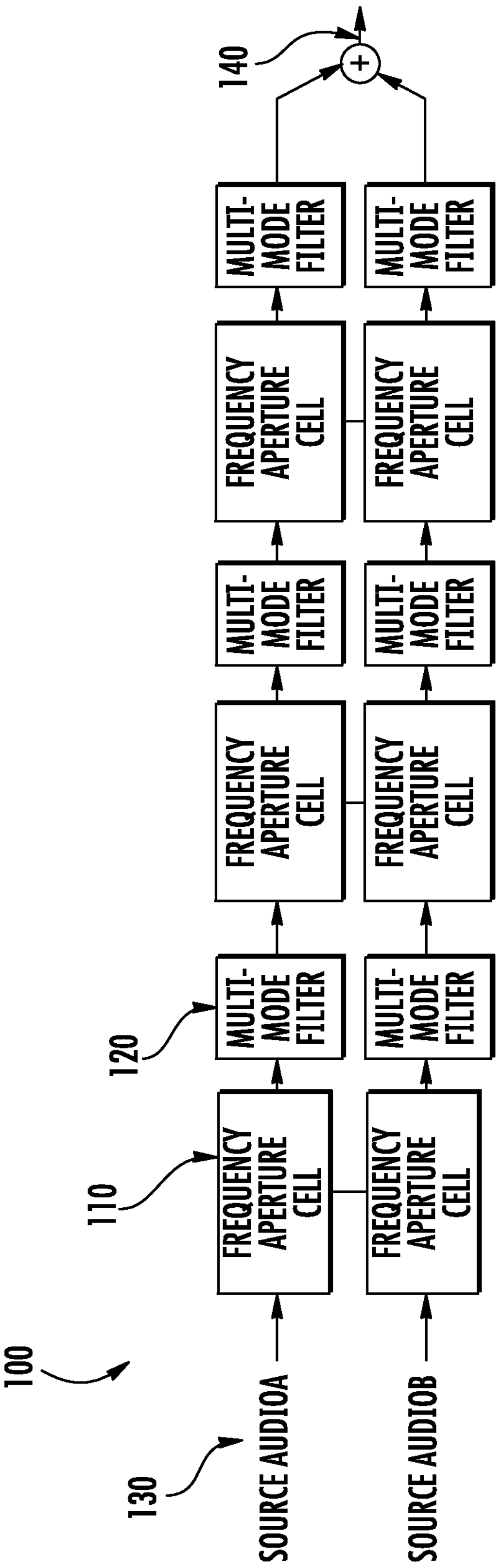
FIG. 1 illustrates a Mock-diagram view showing a 3-series-by-2-parallel array of frequency aperture cells (FACs), in accordance with an embodiment.
Figure 2:
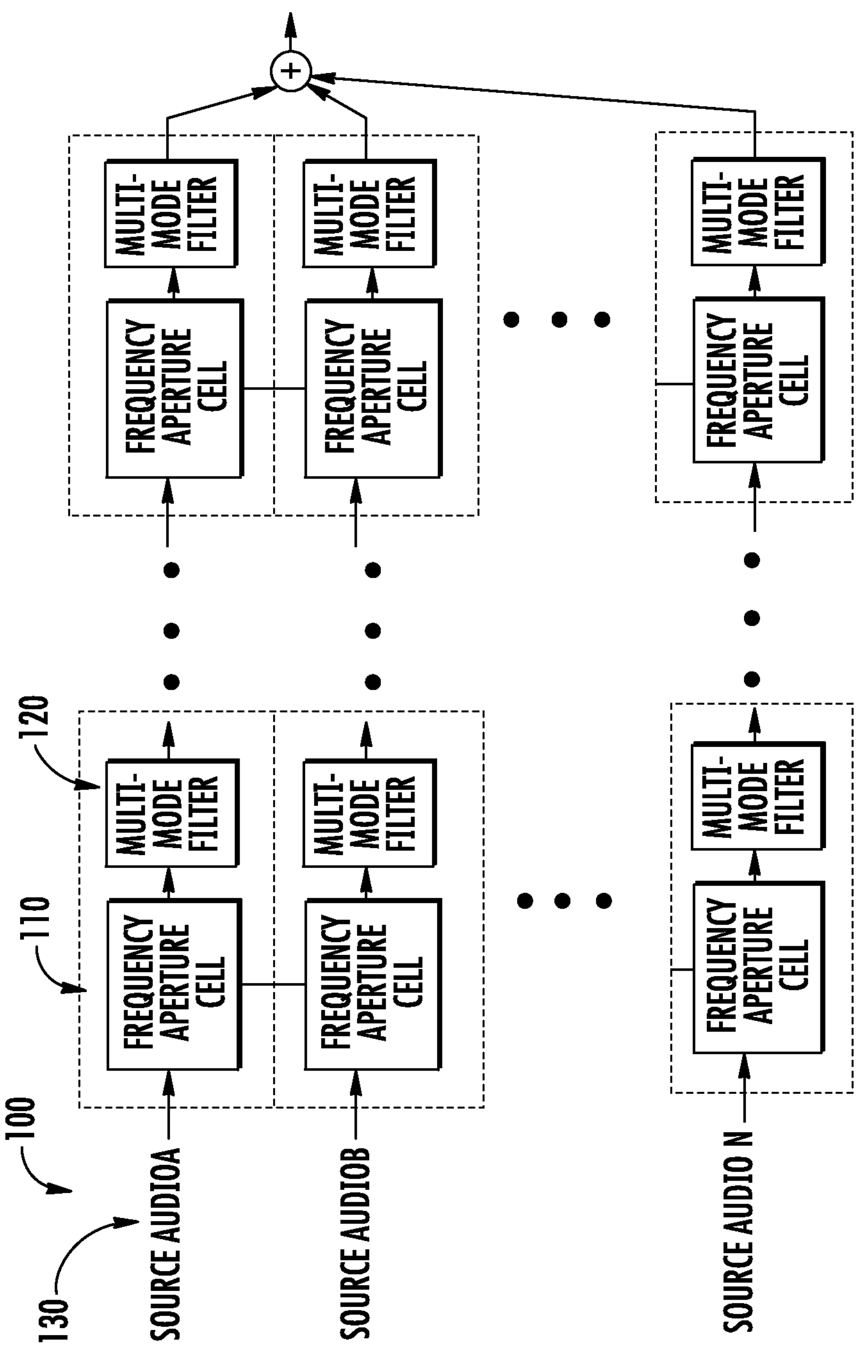
FIG. 2 illustrates a Mock-diagram view showing an n-series-by-m-parallel array of frequency aperture cells (FACs), in accordance with an embodiment.

FIG. 1 illustrates a Mock-diagram view showing a 3-series-by-2-parallel array of frequency aperture cells (FACs) 110, in accordance with an embodiment; while FIG. 2 illustrates a Mock-diagram view showing an n-series-by-m-parallel array of frequency aperture cells (FACs) 110, in accordance with an embodiment. These figures show how filtering the audio source through a sequence of filters creates a series of frequency-bands-with-noise, where the first filter receives the audio source and subsequent filters receive the output of the previous filter as input, with the last filter producing audio output for the system. As shown in FIGS. 1 and 2, each array is organized into n rows by m columns, representing n successive series connections of audio processing, the output of which is then summed with m parallel rows of processing. A channel of mono, stereo, or multi-channel source audio 130 feeds each row. The source audio 130 may be live audio or pre-loaded from a file storage system, such as on the hard drive of a personal computer.

In accordance with an embodiment, frequency aperture arrays 100 (FAAs) may be organized into n series by m parallel connections of frequency aperture cells, and optionally other digital filters such as multimode high pass (HP), band pass (BP), low pass (LP), or band restrict (BR) filters, or resonators of varying type, or combinations. In other embodiments, the multi-mode filter may be omitted.

An advantage of various embodiments of the present invention over previous techniques is how the input audio source 130 can be completely unpitched or unmusical, for example, pure white noise or a person's whisper, and after being synthesized have the ability to be musical, with recognized pitch and timbre components. The output audio 140 is unlimited in its scope, and can include realistic instrument sounds such as violins, piano, brass instruments, etc., electronic sounds, sound effects, and sounds never conceived or heard before.

Previously, musical synthesizers have relied upon stored files (usually pitched) which consist of audio waveforms, either recorded (sample based synthesis) or algorithmically generated (frequency or amplitude modulated synthesis) to provide the audio source which is then synthesized.

By comparison, the systems and methods disclosed herein allow the audio input 130 to be file-based audio sources, real-time streamed input, or combinations. The resulting audio output 140 can be a completely new sound with unlimited scope, in part, because the input source 130 has unlimited scope.

Figure 4A:
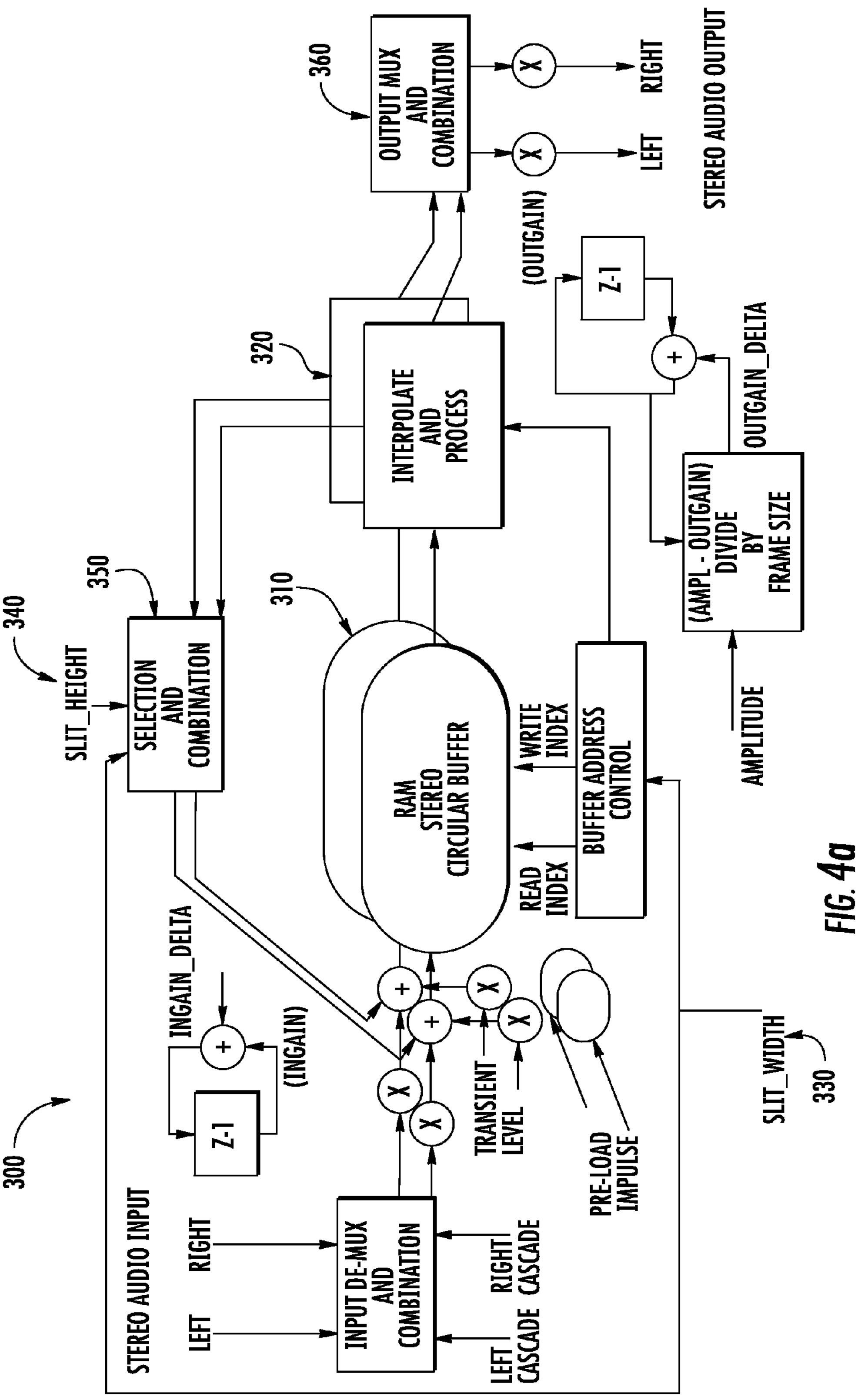
FIG. 4*a* illustrates a Mock-diagram view showing an example of a frequency aperture filter in accordance with an embodiment.
Figure 4B:
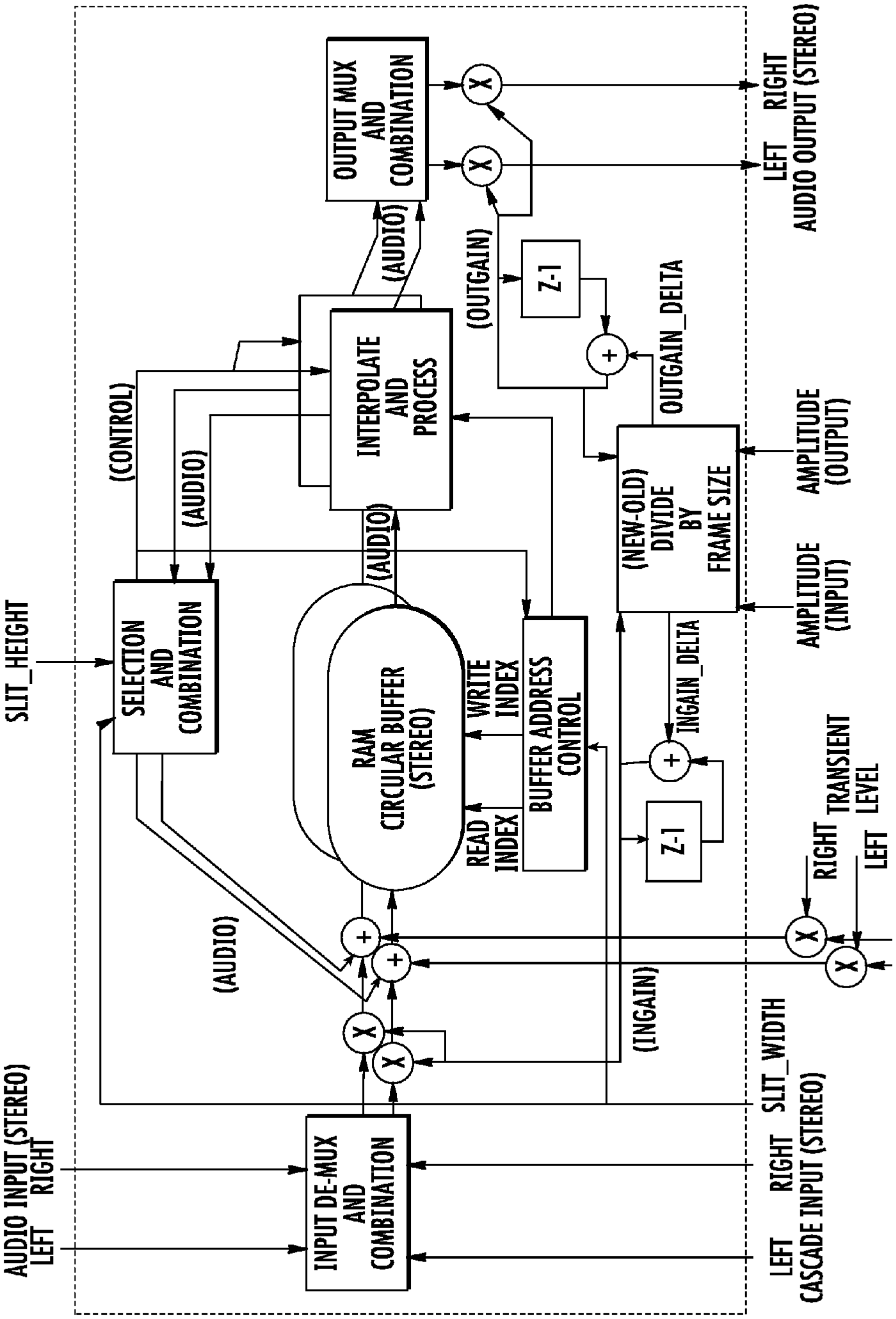
FIG. 4*b* illustrates a Mock-diagram view showing another example of a frequency aperture filter in accordance with another embodiment.

In accordance with an embodiment, the system provides advantages over prior musical synthesis, by employing arrays 100 of frequency aperture cells 110 (FAC) which contain frequency aperture filters (FAF) (See FIGS. 4*a*, 4*b* and accompanying text). FACs 110 have the ability to transform a spectrum of related or unrelated, harmonic or inharmonic input frequencies into an arbitrary, and potentially continuously changing set of new output frequencies. There are no constraints on the type of filter designs employed, only that they have inherent slits of harmonic or in-harmonic frequency bands that separate desired frequency components between their input and output. Both FIR (Finite Impulse Response) and IIR (Infinite Impulse Response) type filter designs are employed within different embodiments of the FAC 110 types. In other embodiments, additive or subtractive filters may be employed. Musically interesting effects are obtained as individual frequency slit width, analogous to frequency spacing, and height, analogous to amplitude, are varied between FAC 110 stages. Frequency slit spacing is a collection of harmonic and/or inharmonic frequency components, for example, harmonic partial frequency would be an example of substantially harmonic. FAC 110 stages are connected in series and in parallel, and can each be modulated by specific modulation signals, such as LFO's, Envelope generators, or by the outputs of prior stages. (See FIGS. 4*a*, 4*b*, 8 and accompanying text.) This demonstrates how to modulate the output of a frequency aperture filter in the sequence using a modulator such as low frequency oscillator modulator, random generator modulator, envelop modulator, and MIDI control modulator.

Frequency spacing from the output of the FAC 110 is often not even (i.e. harmonic), hence the term "slit width" instead of "pitch" is used. "Slit width" can affect both the pitch, timbre or just one or the other, so the use of "pitch" is not appropriate in the context of an FAC 110 array.

In some embodiments, each frequency aperture cell 110 in the array is comprised of its own set of modulators having separate parameters slit width, slit height and amplitude, as well as audio input, a cascade input, an audio output, transient impulse scaling, and a Frequency Aperture Filter (FAF) (See FIGS. 4*a*, 4*b* and accompanying text).

Other advantages of embodiments of the present invention over previous techniques is the use of a real-time streamed audio input to generate the input source 130 which is to be synthesized. In order to facilitate pitched streamed audio input sources 130, in accordance with an embodiment, the system also includes a dispersion algorithm which can take a pitched input source and make it unpitched and noise-like (broad spectrum). This signal then feeds into the system which further synthesizes the audio signal. This allows for a unique attribute in which a person can sing, whisper, talk or vocalize into the dispersion filter, which, when fed into the system and triggered by a keyboard or other source guiding the pitch components of the system synthesizer, can yield an output that sounds like anything, including a real instrument such as a piano, guitar, drumset, etc. The input source 130 is not limited to vocalizations of course. Any pitched input source (guitar, drumset, piano, etc.) can be dispersed into broad spectrum noise and re-synthesized to produce any musical instrument output, for example, using a guitar as input, dispersing the guitar into noise, and re-synthesizing into a piano. This demonstrates how the system can use non-pitched, broad-spectrum audio with no discernible pitch and timbre; and the audio output becomes pitched, musical sounds with discernible pitch and timbre.

The input audio signal 130 can consist of any audio source in any format and be read in via a file-based system or streamed audio. A file-based input may include just the raw PCM data or the PCM data along with initial states of the FAA filter parameters and/or modulation data.

In accordance with an embodiment, the system also allows multiple synthesis to be combined to create unique hybrid sounds. Finally, embodiments of the invention include a method of using multiple impulse responses, mapped out across a musical keyboard, as an additional input source to the FAA filters, designed, but not limited to, synthesizing the first moments of a sound.

Figure 3:
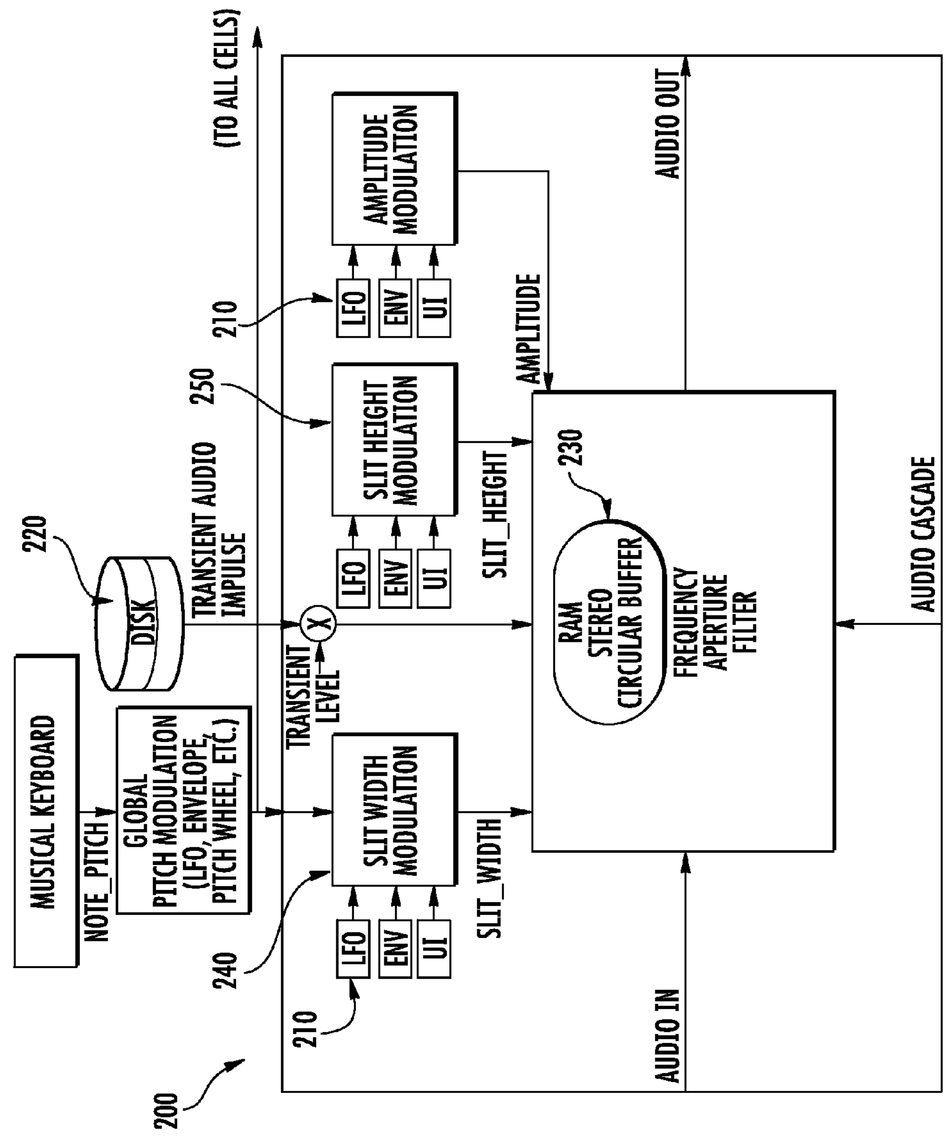
FIG. 3 illustrates a block-diagram view an isolated frequency aperture cell (FAC) within an frequency aperture array, along with device connections, in accordance with an embodiment.

FIG. 3 illustrates a block-diagram view showing an isolated frequency aperture cell 210 (FAC) within an frequency aperture array, along with device connections, in accordance with an embodiment. In accordance with an embodiment, the system uses an array of audio frequency aperture cells 200, which separate noise components into harmonic and inharmonic frequency multiples. Storage of control parameters 210, such as modulation and other musical controls, and source or impulse transient audio files come from a storage system 220, such as a hard drive or other storage device. A unique set of each of these files and parameters is loaded into runtime memory for each Frequency Aperture Cell 210 in the array. The system may be built of software, hardware, or a combination of both. With the data packed and unpacked into interleave channels of data (e.g. RAM Stereo Circular Buffer 230), four channels can be processed simultaneously.

Each frequency aperture cell 200, with varying feedback properties, produces instantaneous output frequency based on both the instantaneous spectrum of incoming audio, as well as the specific frequency slits and resonance of the aperture filter. Two controlling properties are the frequency slit spacing (slit width) 240 and the noise-to-frequency band ratio, or frequency (slit height) 250.

An important distinction of constituent FAA cells 200 is that their slit widths 240 are not necessarily representative of the pitch of the perceived audio output. FAA cells 200 may be inharmonic themselves, or in the case of two or more series cascaded harmonic cells of differing slit width 240, they may have their aperture slits at non-harmonic relationships, producing inharmonic transformations through cascaded harmonic cells. The perceived pitch is often a complex relationship of the slit widths and heights of all constituent cells and the character of their individual harmonic and inharmonic apertures. The slit width 240 and height 250 are as important to the timbre of the audio as they are to the resultant pitch.

In accordance with an embodiment, this system and method are provided by employing arrays of frequency aperture cells 200. FACs 200 have the ability to transform a spectrum of related or unrelated, harmonic or inharmonic input frequencies into an arbitrary, and potentially continuously changing set of new output frequencies. There are no constraints on the type of filter designs employed, only that they have inherent slits of harmonic or in-harmonic frequency bands that separate desired frequency components between their input and output. Both FIR (Finite Impulse Response) and IIR (Infinite Impulse Response) type designs are employed within different embodiments of the FAA types. Musically interesting effects are obtained as individual frequency slit width, analogous to frequency spacing, and height, analogous to amplitude, are varied between FAC 200 stages. This demonstrates how varying the parameters between the filters in the sequence is useful.

In accordance with an embodiment, FAC 200 stages are connected in series and in parallel, and can each be modulated by specific modulation signals, such as LFO's, Envelope generators, or by the outputs of prior stages. This demonstrates how to modulate the output of a filters in the sequence using the output of another filter in the sequence, for example, from another row in the array.

This further demonstrates how to filter the audio source through the first filter to into a series of frequency-bands-with-noise, then suppressing high energy bands to increase feedback in the series of frequency-bands-with-noise, then re-filtering the series of frequency-bands-with-noise through a second filter; and outputting the series of frequency-bands-with-noise as audio output to produce musical sound.

FIG. 4*a* illustrates a Mock-diagram view showing an example of a frequency aperture filter in accordance with an embodiment; while FIG. 4*b* illustrates a block-diagram view showing another example of a frequency aperture filter in accordance with another embodiment. These figures show how selected parameters to specify the desired frequency slit spacing and the desired noise-to-frequency band ratio can be used to filter and conform conforming the series of frequency-bands-with-noise to the parameters to produce the desired frequency slit spacing and the desired noise-to-frequency band ratio.

Before discussing frequency aperture filters, some analogous inspiration may help understanding. White noise is a sound that covers the entire range of audible frequencies, all of which possess similar intensity. An approximation to white noise is the static that appears between FM radio stations. Pink noise contains all frequencies of the audible spectrum, but with a decreasing intensity of roughly three decibels per octave. This decrease approximates the audio spectrum composite of acoustic musical instruments or ensembles.

At least one embodiment of the invention was inspired by the way that a prism can separate white light into it's constituent spectrum of frequencies. White noise can be thought of as analogous to white light, which contains roughly equal intensities of all frequencies of visible light. A prism can separate white light into it's constituent spectrum of frequencies, the resultant frequencies based on the material, internal feedback interference and spectrum of incoming light.

Among other factors, frequency aperture cells (FACs) (See FIG. 3 and accompanying text) do analogously with audio, based on their type, feedback properties, and the spectrum of incoming audio. Another aspect of an embodiment of the invention deals with the conversion of incoming pitched sounds into wide-band audio noise spectra, while at the same time preserving the intelligibility, sibilance, or transient aspect of the original sound, then routing the sound through the array of FAC's.

In accordance with an embodiment, frequency aperture filters 300 (FAF) may be embodied as single or multiple digital filters of either the IIR (Infinite Impulse Response) or FIR (Finite Impulse Response) type, or any combination thereof. One characteristic of the filters 300 is that both timbre and pitch are controlled by the filter parameters, and that input frequencies of adequate energies that line up with the multiple pass-bands of the filter 300 will be passed to the output of the collective filter 300, albeit of potentially differing amplitude and phase.

In one example embodiment, an input impulse or other initialization energy is preloaded into a multi-channel circular buffer 310. A buffer address control block calculates successive write addresses to preload the entire circular buffer with impulse transient energy whenever, for example, a new note is depressed on the music keyboard.

The circular buffer arrangement allows for very efficient usage of the CPU and memory, which may reduce required amount of computer hardware resources needed to perform real-time processing of the audio synthesis. In other embodiments, the efficient usage of computer resources allows processing of the system and methods in a virtual computing environment, such as, a java virtual machine.

In accordance with an embodiment, Left and Right Stereo or mono audio is de-multiplexed into four channels, based on the combination type desired for the aperture spacing. This is the continuous live streaming audio that follows the impulse transient loading.

Figure 6:
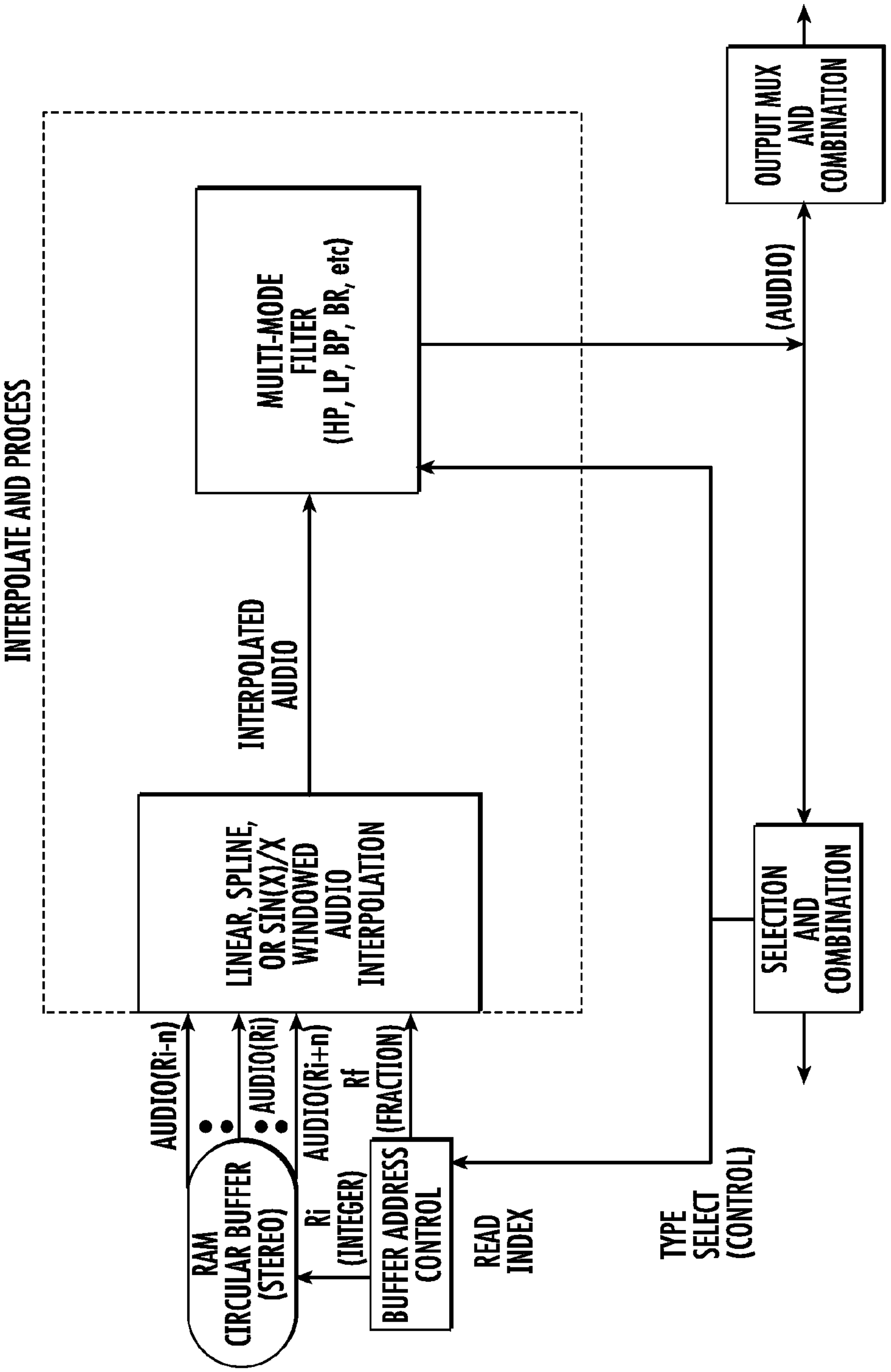
FIG. 6 illustrates a block-diagram view showing the interpolate and process block of FIGS. 4*a* and 4*b* in accordance with an embodiment.

After that, continuous, successive write addresses are generated by the buffer address control for incoming combined input samples, as well as for successive read addresses for outgoing samples into the Interpolation and Processing block 320 (See also FIG. 6).

In one example buffer address calculation, the read address is determined by the write address, by subtracting from it a base tuning reference value divided by the read pitch step size. The base tuning reference value is calculated from the FAF 300 filter type, via lookup table or hard calculations, as different FAF 300 filter types change the overall delay through the feedback path and are therefore pitch compensated via this control. The same control is deployed to the multi-mode filter in the interpolate and processing block (See FIG. 6), as this variable filter contributes to the overall feedback delay which contributes to the perceived pitch through the FAF 300. The read step size is calculated from the slit_width 330 input. The pass bands of the filter may be determined in part by the spacing of the read and write pointers, which represent the Infinite Impulse, or feedback portion of an IIR filter design. The read address in this case may have both an integer and fractional component, the later of which is used by the interpolation and processing block 320.

Looking ahead to FIG. 6 illustrates a Mock-diagram view showing the interpolate and process block of FIGS. 4*a* and 4*b* in accordance with an embodiment. In accordance with an embodiment, the Interpolate and Process block 320 is used to lookup and calculate a value “in between” two successive buffer values at the audio sample rate. The interpolation may be of any type, such as well known linear, spline, or sine(x)/x windowed interpolation. By virtue of the quad interleave buffer, and corresponding interleave coefficient and state variable data structures, four simultaneous calculations may be performed at once. In addition to interpolation, the block processing includes filtering for high-pass, low-pass, or other tone shaping. The four interleave channels have differing, filter types and coefficients, for musicality and enhancing stereo imaging. In addition, there may be multiple types of interpolation needed at once, one to resolve the audio sample rate range via up-sampling and down-sampling, and one to resolve the desired slit_width.

Turning back to FIG. 5 illustrates a Mock-diagram view showing the selection and combination block of FIGS. 4*a* and 4*b* in accordance with an embodiment. The Selection and combination block 350 is comprised of adaptive stability compensation filtering based on the desired slit_width, slit height, and FAF Type. The audio frequency components from the Interpolate and Process block 320 are combined by applying adaptive filtering as needed to attenuate the frequency bands of maximum amplitude, then mixing the harmonic-to-noise ratios together at different amplitudes.

Figure 5:
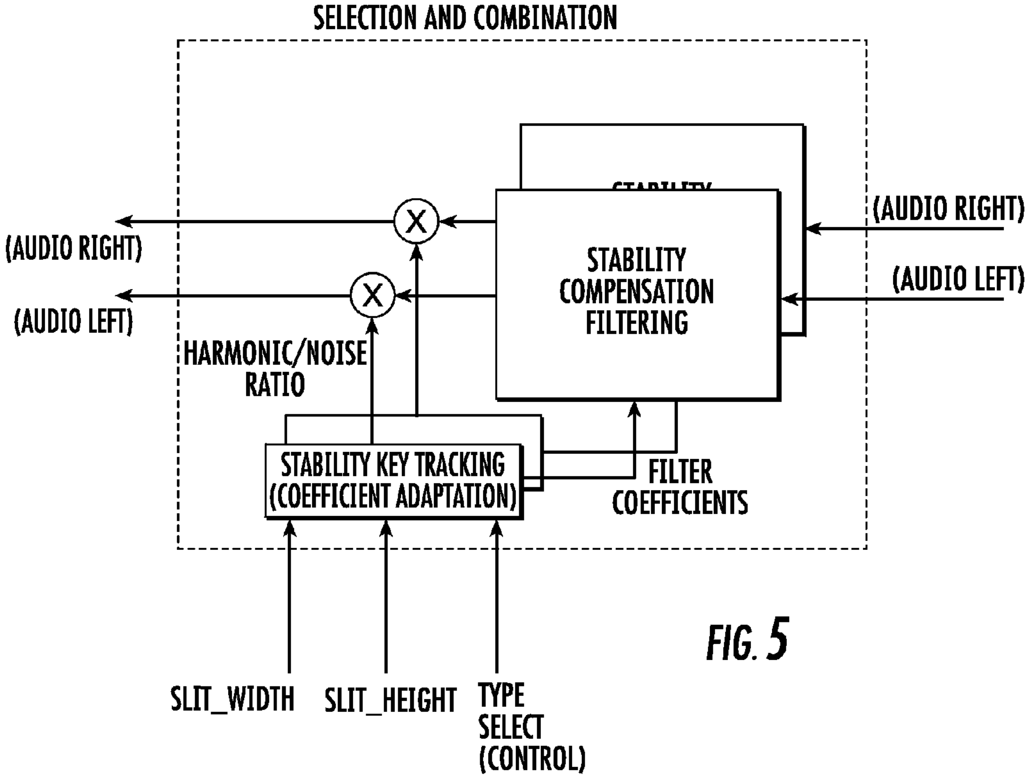
FIG. 5 illustrates a block-diagram view showing the selection and combination block of FIGS. 4*a* and 4*b* in accordance with an embodiment.
Figure 9:
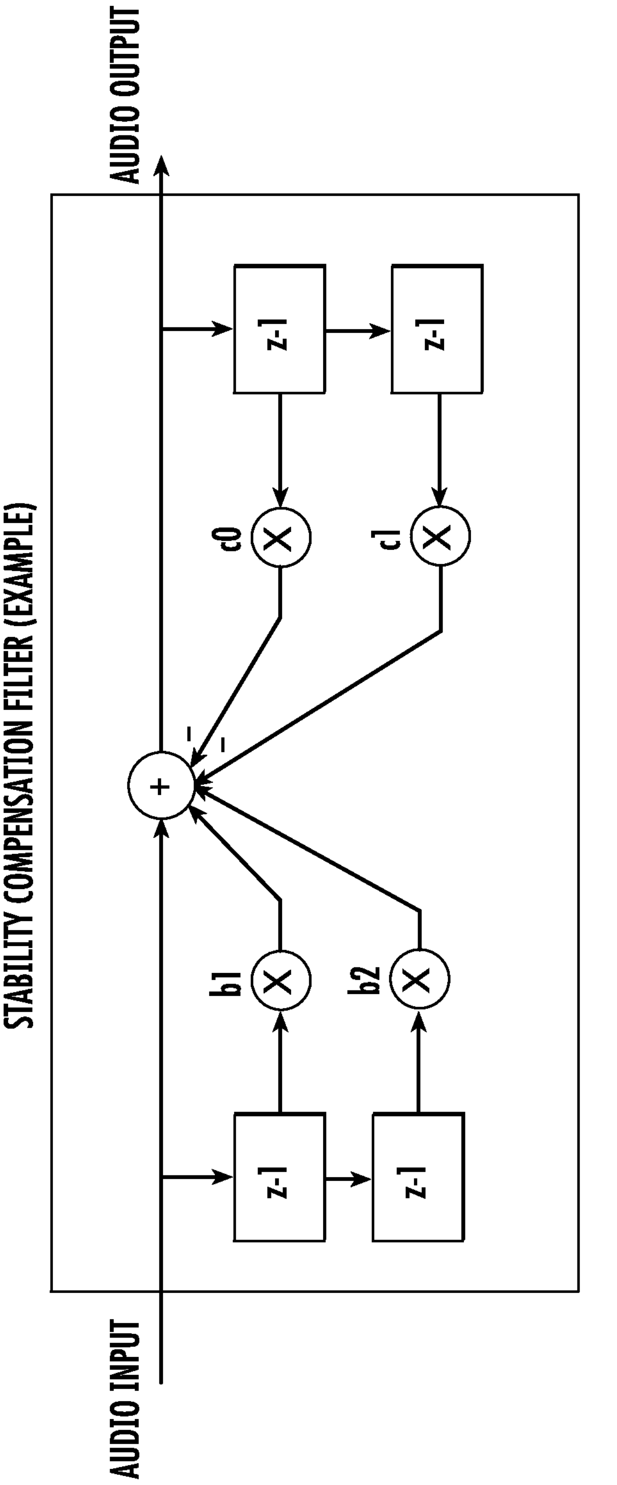
FIG. 9 illustrates a block-diagram view showing the stability compensation filter of FIG. 5 in accordance with an embodiment.

Turning ahead to FIG. 9 illustrates a block-diagram view showing the stability compensation filter of FIG. 5 in accordance with an embodiment. Shown is an example digital biquad filter, however, other types of stabilization techniques may be used. Stability compensation filtering allows for maintaining stability and harmonic purity of a recursive IIR design at relatively higher values of slit_width and slit height, which may be changing continuously in value. The stability coefficients are adapted over time based on the changing values of key pitch, slit_height (harmonic/noise ratio), and slit width (frequency partial spacing). For example, higher note pitch and wider slit_width (higher partial spacing) may generally require greater attenuation of lower frequency bands in order to maintain filter stability.

The stability compensation filter may calculate a co-efficient of the stability filter to prevent the system from passing of unity gain. A key tracker (also known as a key scaler) scales the incoming musical note key according to linear or nonlinear functions which may be of simple tabular form. The stability compensation filter may use a key tracker in its calculations to determine the desired amount of noise-to-feedback ratio. The stability compensation filter may use a key tracker to determine the desired amount of frequency slit spacing (e.g. variations on slit_width).

Again on FIGS. 4*a* and 4*b*, after interpolation and processing 320, the audio is multiplexed in the output mux and combination block 360. The output multiplexing complements both the input de-multiplexing and the selection and combination blocks to accumulate the desired output audio signal and aperture spacing character.

Figure 7:
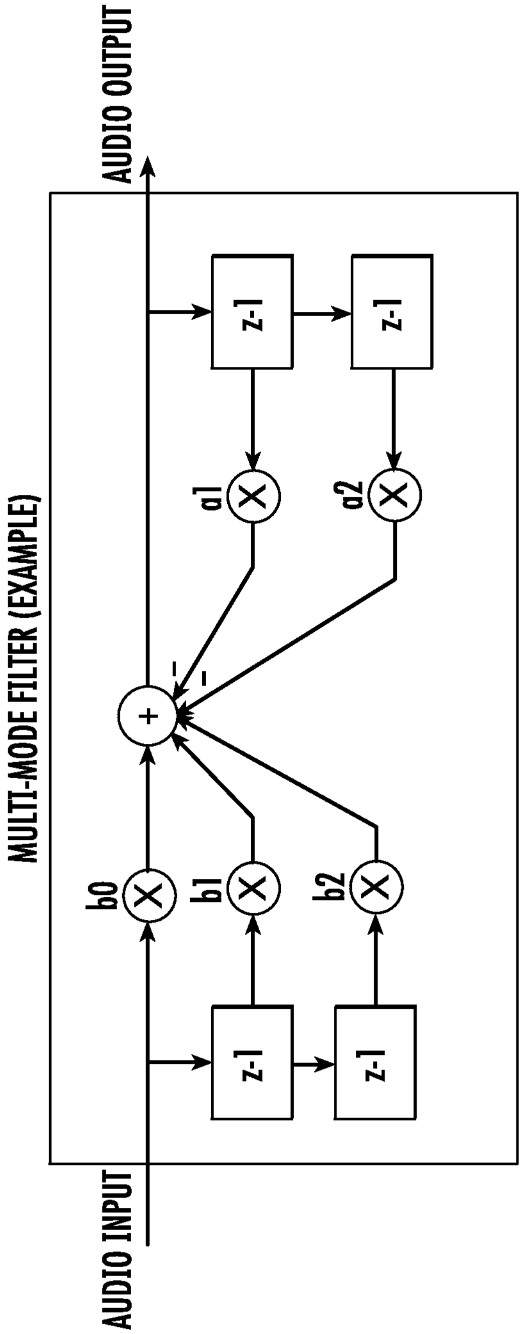
FIG. 7 illustrates a Mock-diagram view showing one example of a multi-mode filter, which may be used in FIGS. 4*a* and 4*b* in accordance with an embodiment.

FIG. 7 illustrates a Mock-diagram view showing one example of a multi-mode filter, which may be seen in FIGS. 1 and 2 in accordance with an embodiment. Multi-mode filters may be optionally used in frequency aperture arrays. Examples of multi-mode filters include, high pass, low pass, band pass, band restrict, and combinations. This demonstrates how multimode filters the output of each filter in the sequence using a multi-mode-filter such as a lowpass filter, highpass filter, bandpass filter, and bandreject filter.

Figure 8:
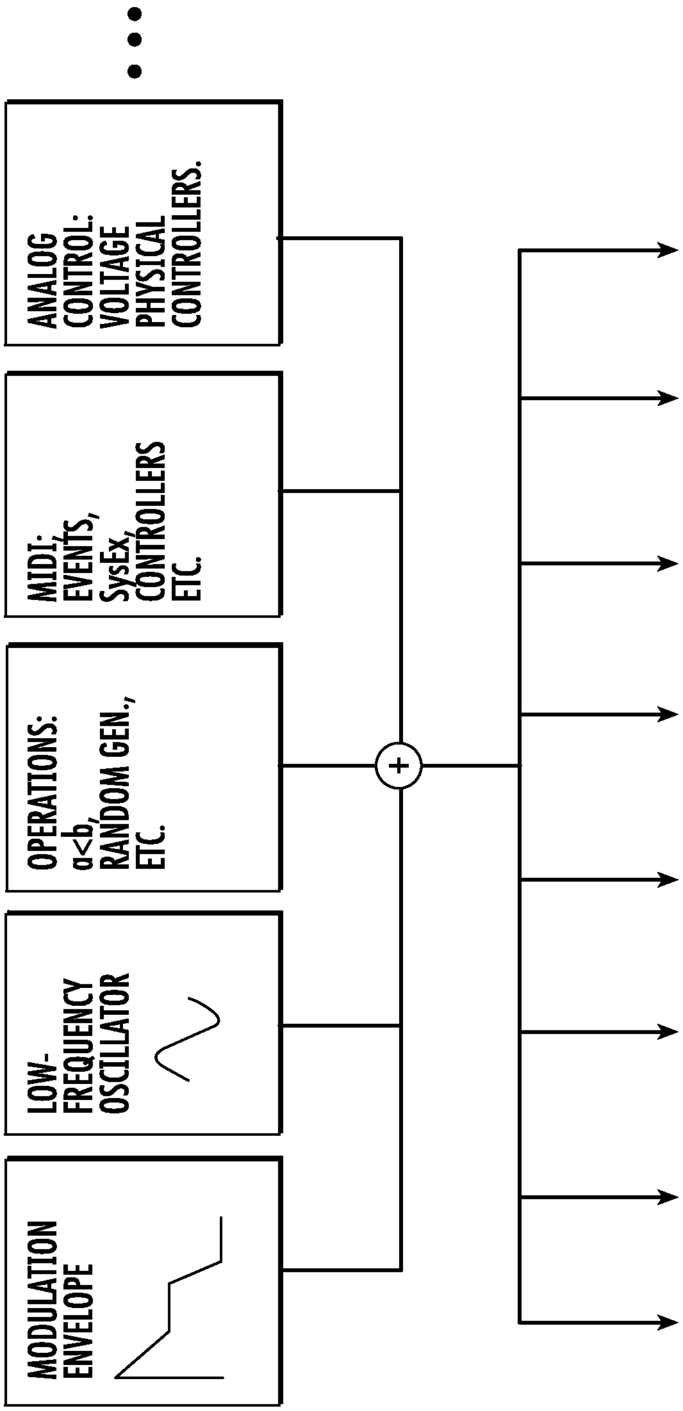
FIG. 8 illustrates a Mock-diagram view showing various modulators in accordance with an embodiment.

FIG. 8 illustrates a Mock-diagram view showing various modulators in accordance with an embodiment. The input audio signal itself can be subject to modulation by various methods including algorithmic means (random generators, low frequency oscillation (LFO) modulation, envelope modulation, etc.), MIDI control means (MIDI Continuous Controllers, MIDI Note messages, MIDI system messages, etc.); or physical controllers which output MIDI messages or analog voltage, as shown. Other modulation methods may be possible as well.

Figure 10:
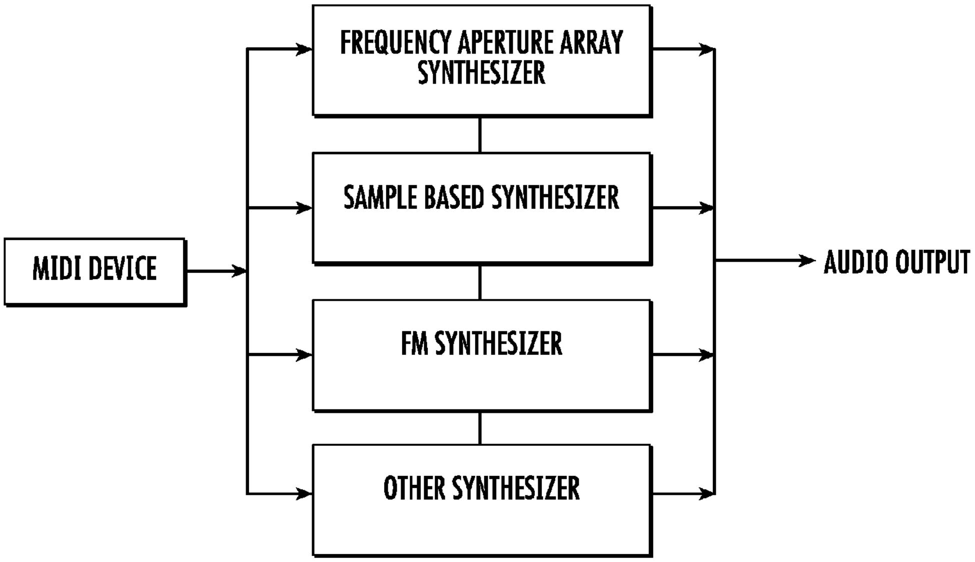
FIG. 10 illustrates a block-diagram view showing how an audio input source into the FAA synthesizer can be modulated before entering the FAA filters, and how the FAA filters themselves can be modulated in real-time, in accordance with an embodiment.

FIG. 10 illustrates a block-diagram view showing how an audio input source into the FAA synthesizer can be modulated before entering the FAA filters, and how the FAA filters themselves can be modulated in real-time, in accordance with an embodiment. In particular, this shows how an audio input source into the FAA synthesizer may be modulated before entering the FAA filters. It also shows how the FAA filters themselves can be modulated in real-time. In some embodiments the FAA synthesis can be combined with other synthesis methods, in accordance with various embodiments. In some embodiments, a console or keyboard-like application may be employed, which can be used with the system as described herein.

Figure 11A:
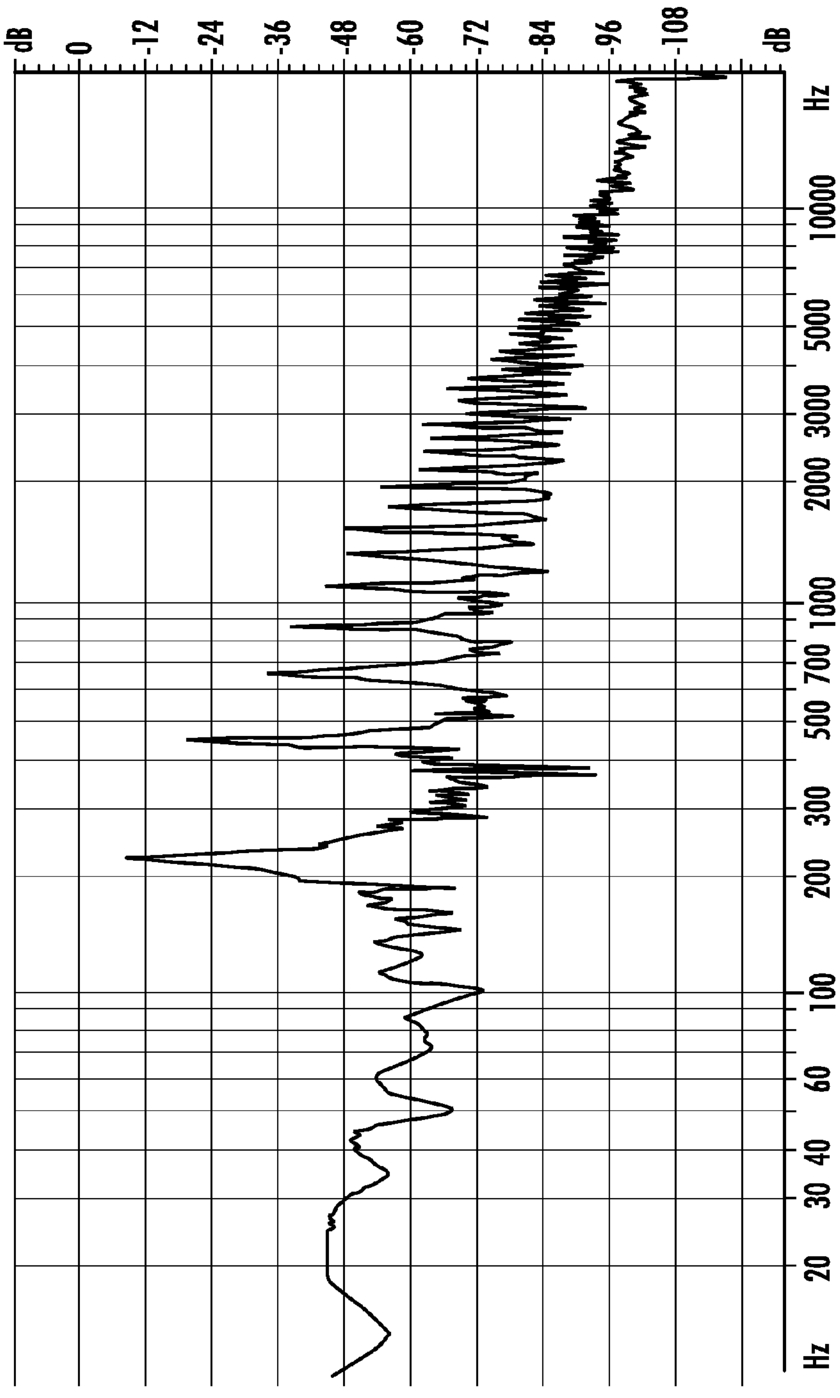
FIG. 11*a* illustrates a FFT spectral waveform graph view showing a slit_height of 100% in accordance with an embodiment.
Figure 11B:
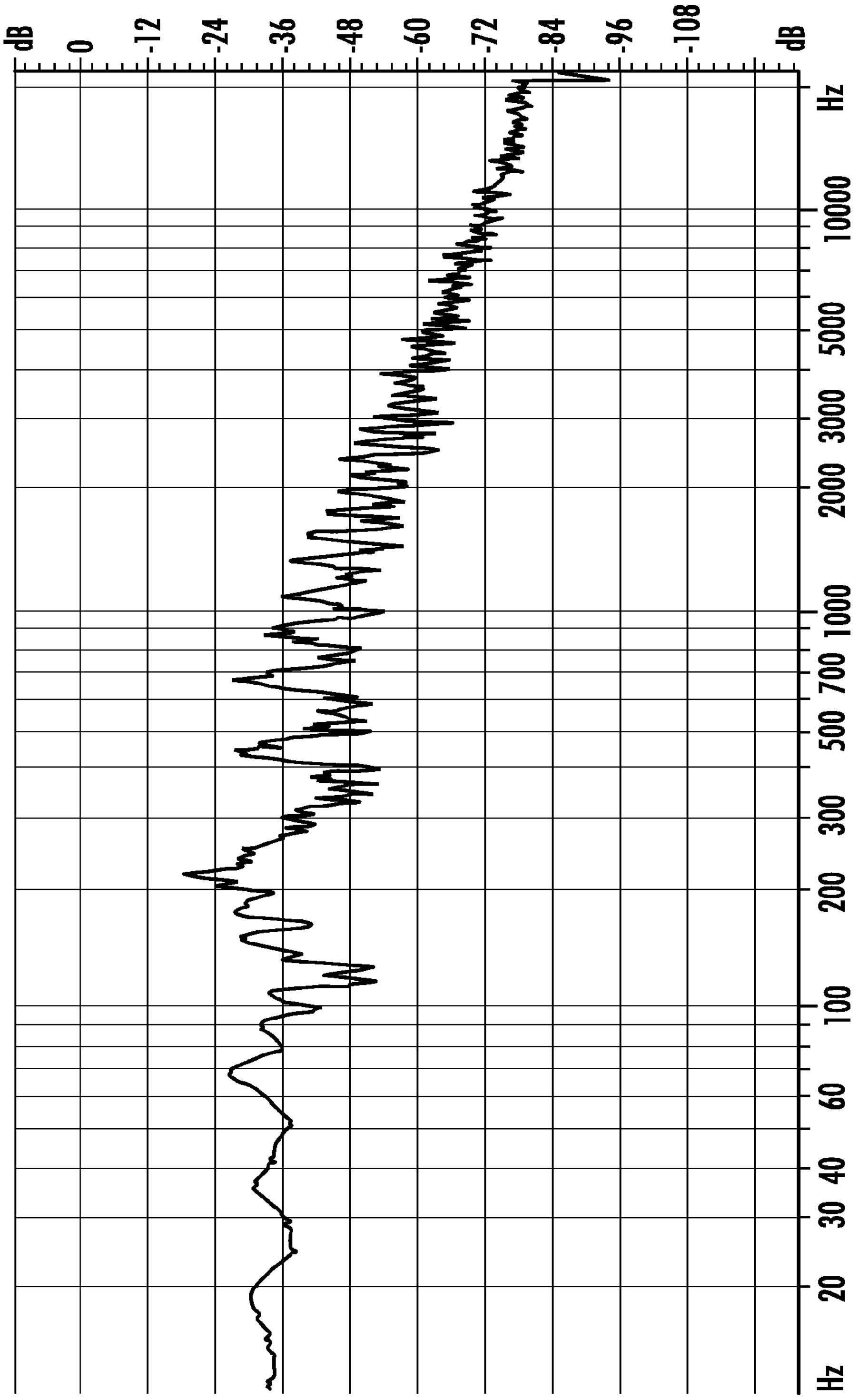
FIG. 11*b* illustrates a FFT spectral waveform graph view showing a slit_height of 50% in accordance with an embodiment.
Figure 11C:
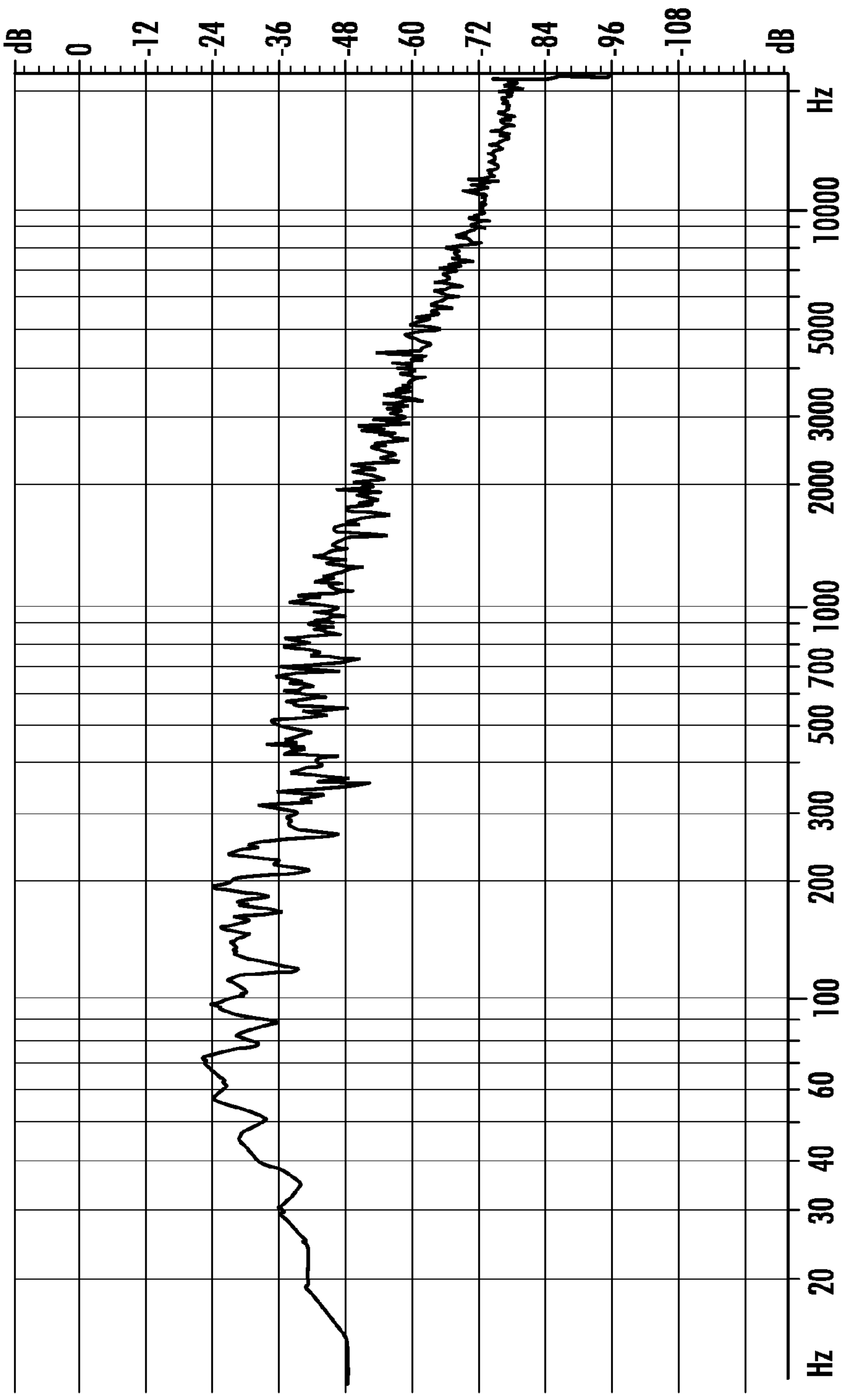
FIG. 11*c* illustrates a FFT spectral waveform graph view showing a slit_height of 0% in accordance with an embodiment.
Figure 11D:
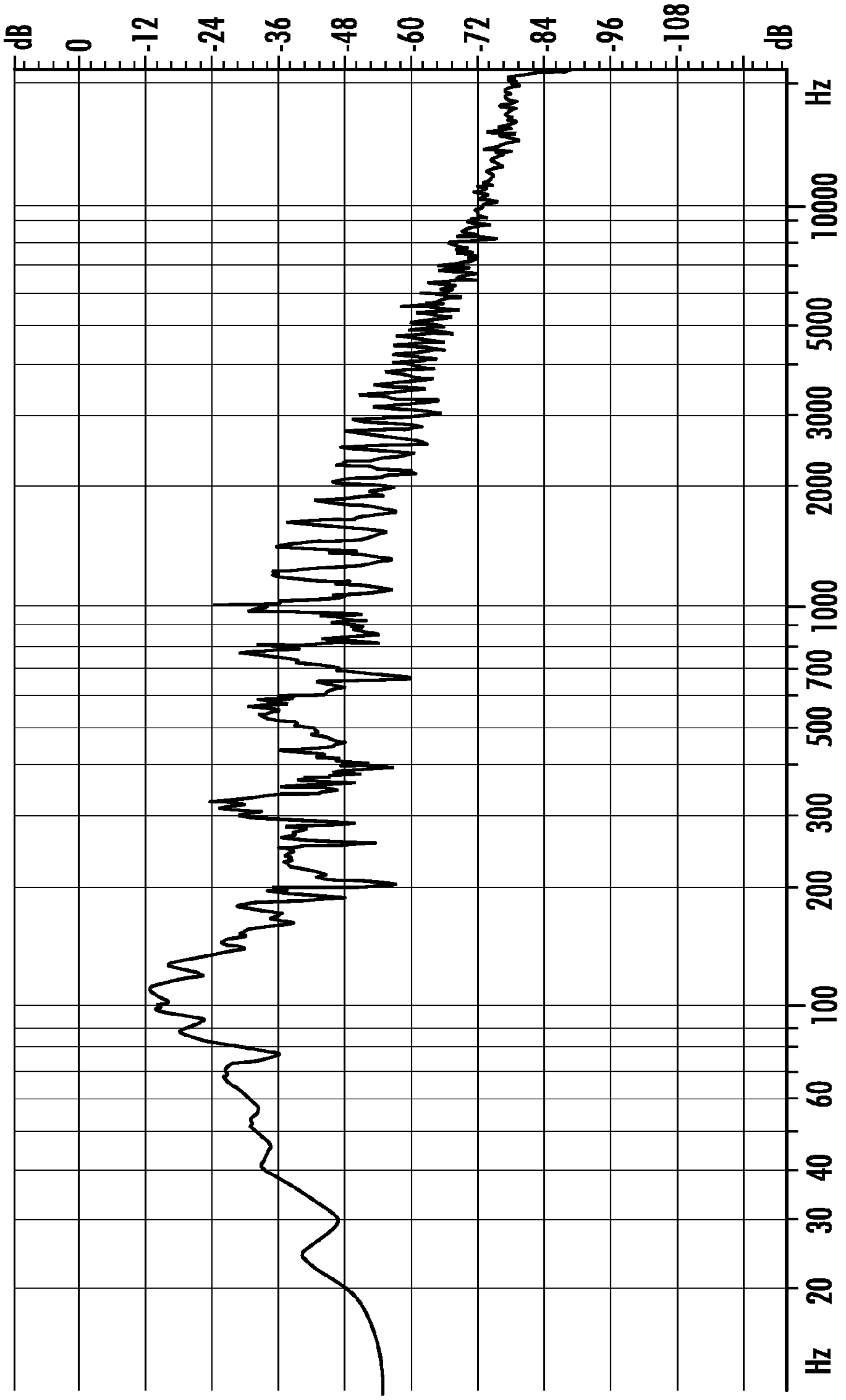
FIG. 11*d* illustrates a FFT spectral waveform graph view showing a slit_height of −50% in accordance with an embodiment.
Figure 11D:
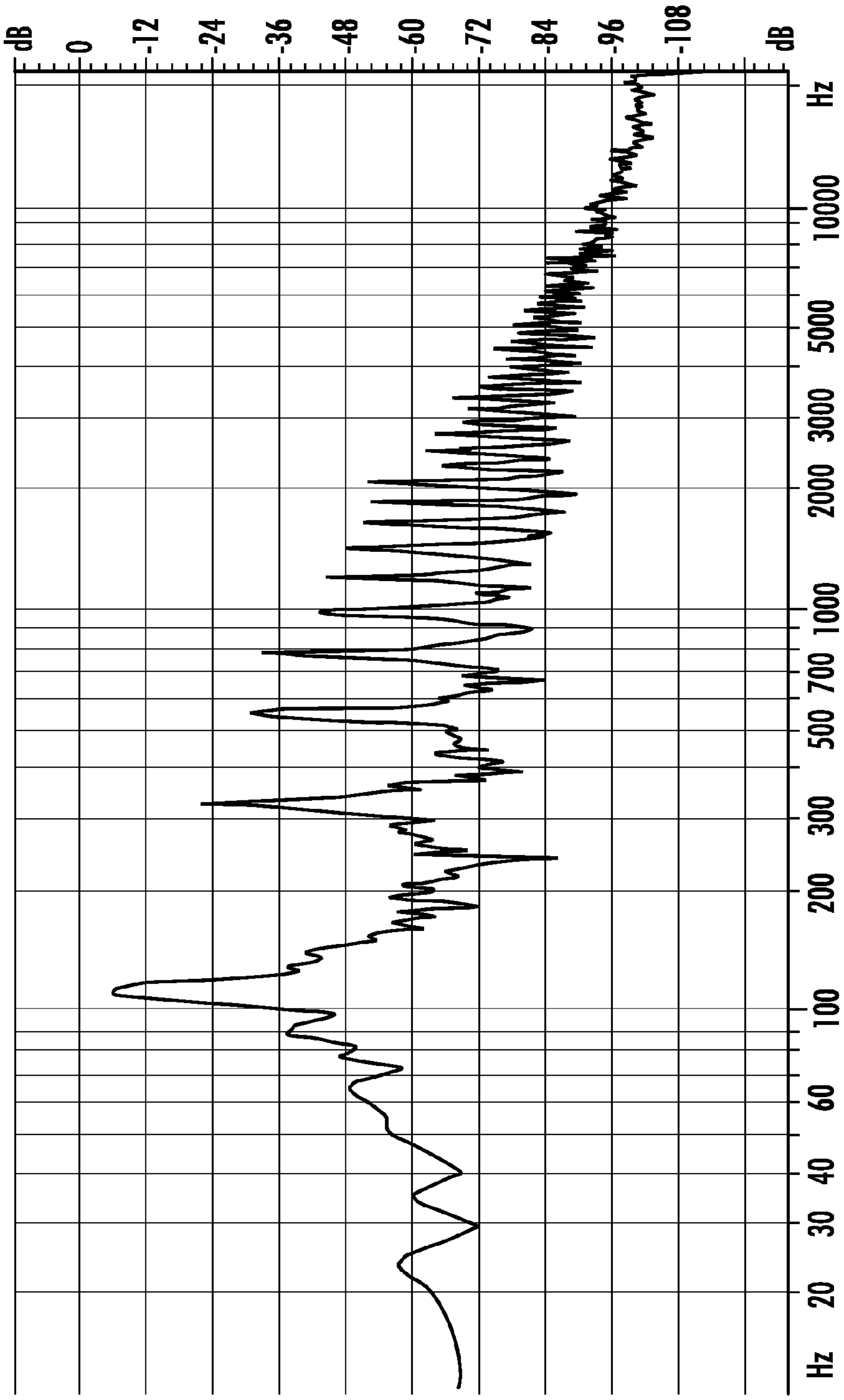
Figure 11E:
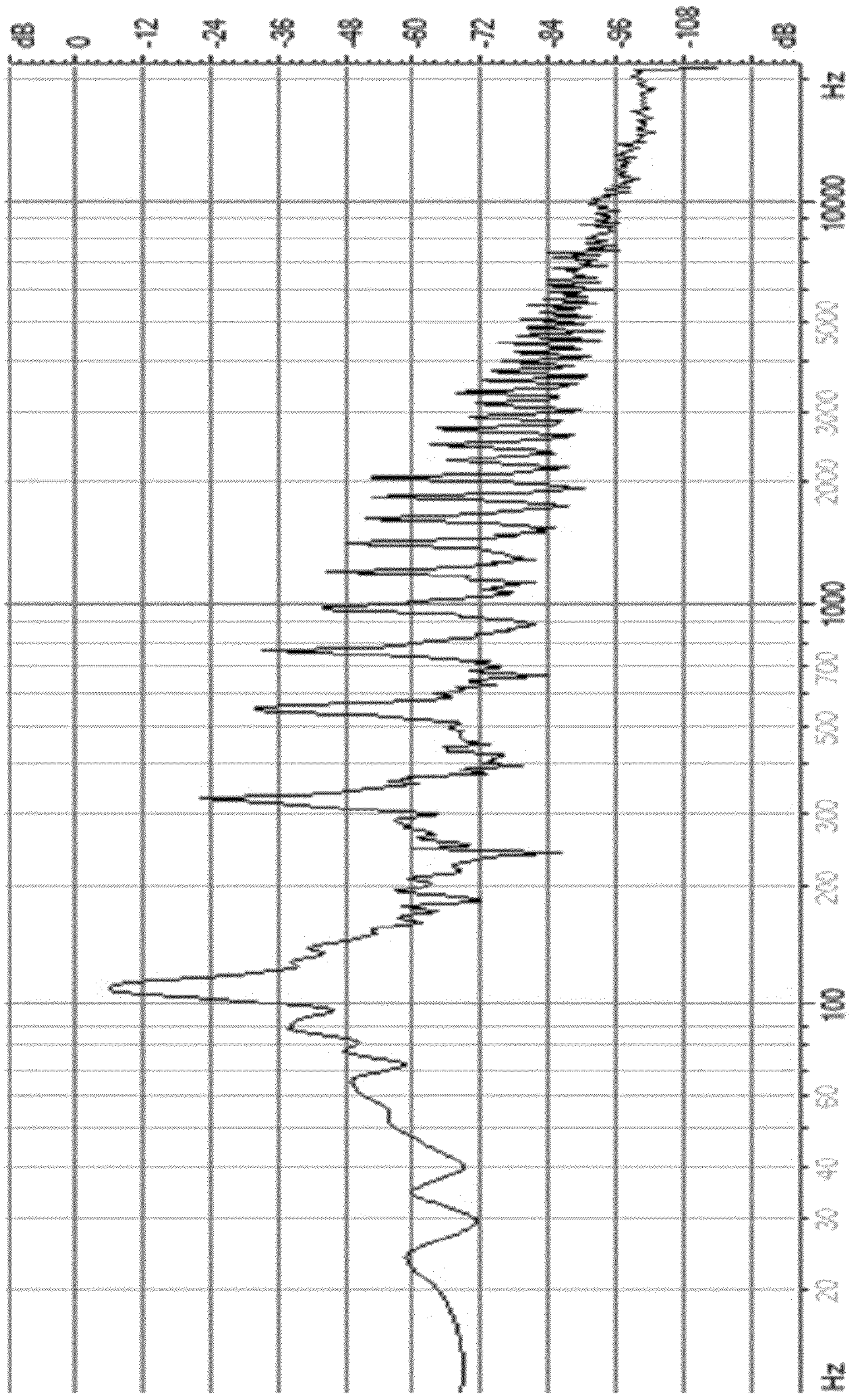
FIG. 11*e* illustrates a FFT spectral waveform graph view showing a slit_height of −100% in accordance with an embodiment.

FIG. 11*a* illustrates a FFT spectral waveform graph view showing a slit_height of 100% in accordance with an embodiment; FIG. 11*b* illustrates a FFT spectral waveform graph view showing a slit_height of 50% in accordance with an embodiment; FIG. 11*e* illustrates a FFT spectral waveform graph view showing a slit_height of 0% in accordance with an embodiment; FIG. 11*d* illustrates a FFT spectral waveform graph view showing a slit_height of −50% in accordance with an embodiment; and FIG. 11*e* illustrates a FFT spectral waveform graph view showing a slit_height of −100% in accordance with an embodiment. Taken together, FIGS. 11*a*, 11*b*, 11*d*, and 11*e* show how the spectral waveforms change as a result of processing through a frequency aperture filter. Because slit_height is 0% in FIG. 11*c*, it shows the unprocessed waveform (e.g. noise) that was use as input to the frequency aperture filter. Peaks can be seen approximately every 200 db. The first peak varies by about one octave from 100% slit_height to −100% slit_height.

Figure 12:
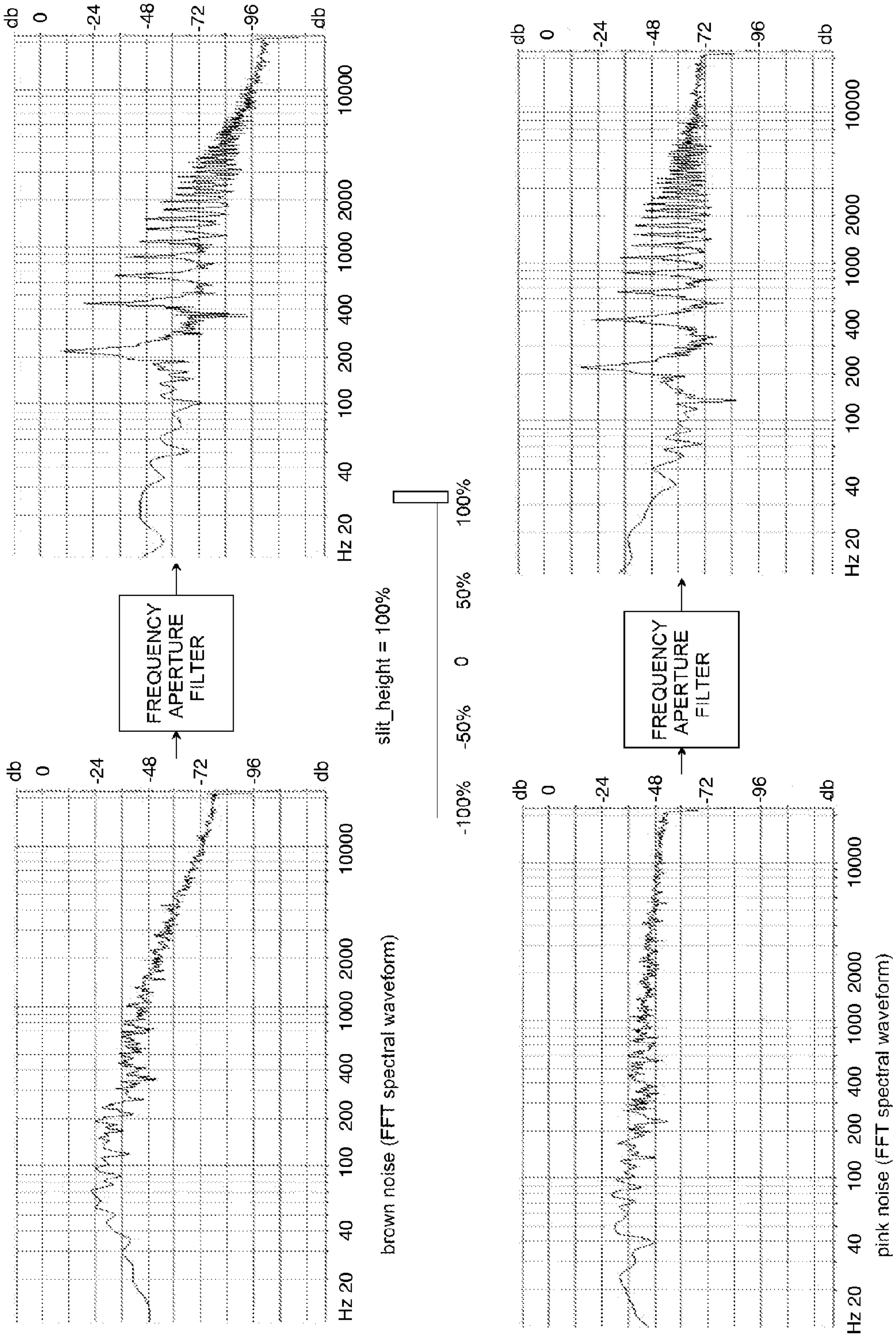
FIG. 12 illustrates a FFT spectral waveform graph view showing a comparison of brown noise and pink noise as audio input in accordance with an embodiment.

FIG. 12 illustrates a FFT spectral waveform graph view showing a comparison of brown noise and pink noise as audio input in accordance with an embodiment. In this graph, it can be seen that the synthesized brown noise has less energy at higher frequencies (similar to the brown noise input). By comparison, the pink noise has consistent energy levels at higher frequencies (similar to the pink noise input).

Figure 13:
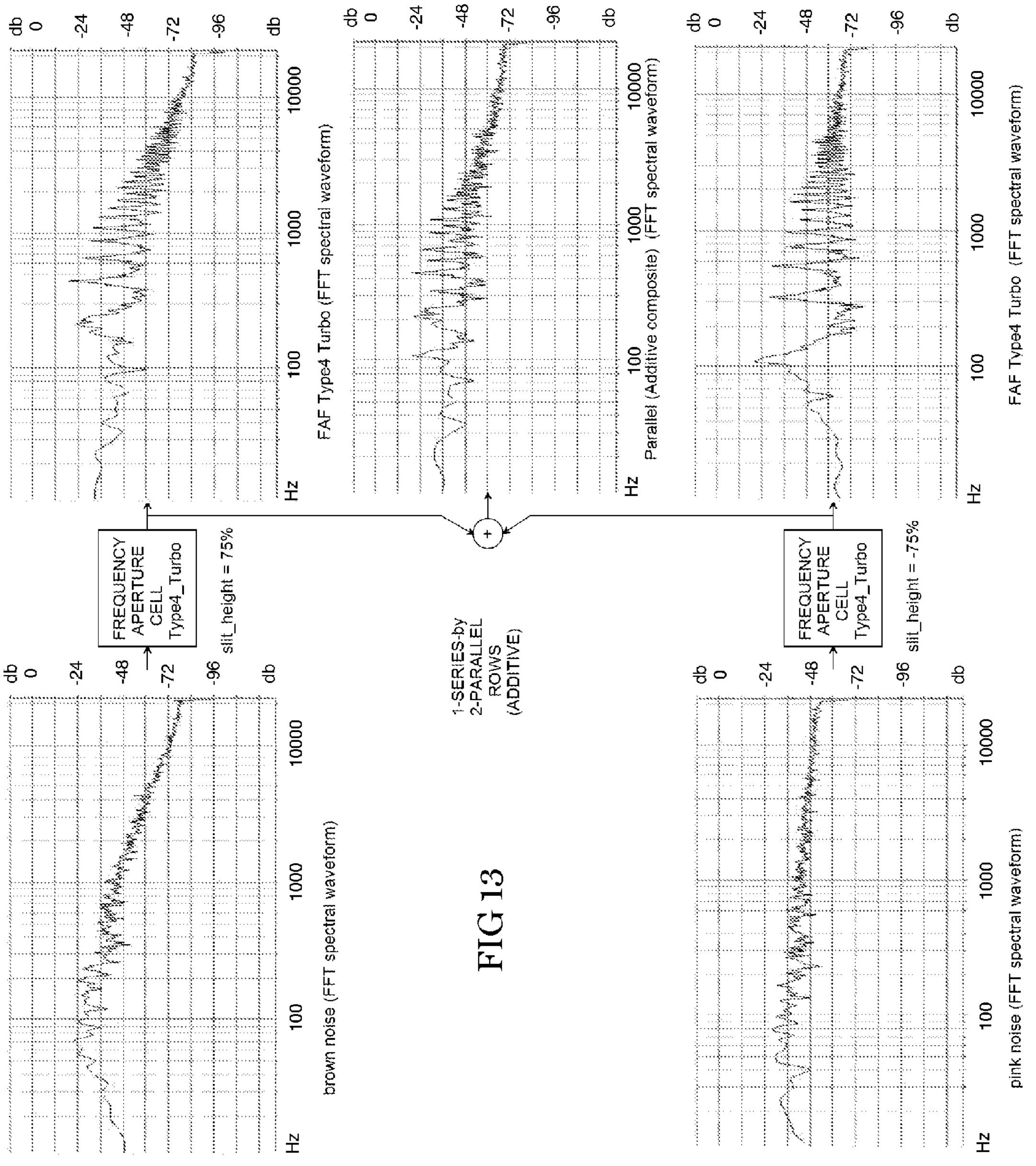
FIG. 13 illustrates a FFT spectral waveform graph view showing a series of waveforms in a 1-series-by-2-parallel array, including waveforms for audio input, waveforms for output from each FAC, and a final waveform for audio output in accordance with an embodiment.

FIG. 13 illustrates a FFT spectral waveform graph view showing a series of waveforms in a 1-series-by-2-parallel array, including waveforms for audio input, waveforms for output from each FAC, and a final waveform for audio output in accordance with an embodiment. In this series of waveforms, brown noise and white noise are shown as input. After processing through a frequency aperture cell, the resulting waveform is displayed. Finally, the combination of the two results is shown as the parallel additive composite.

Figure 14:
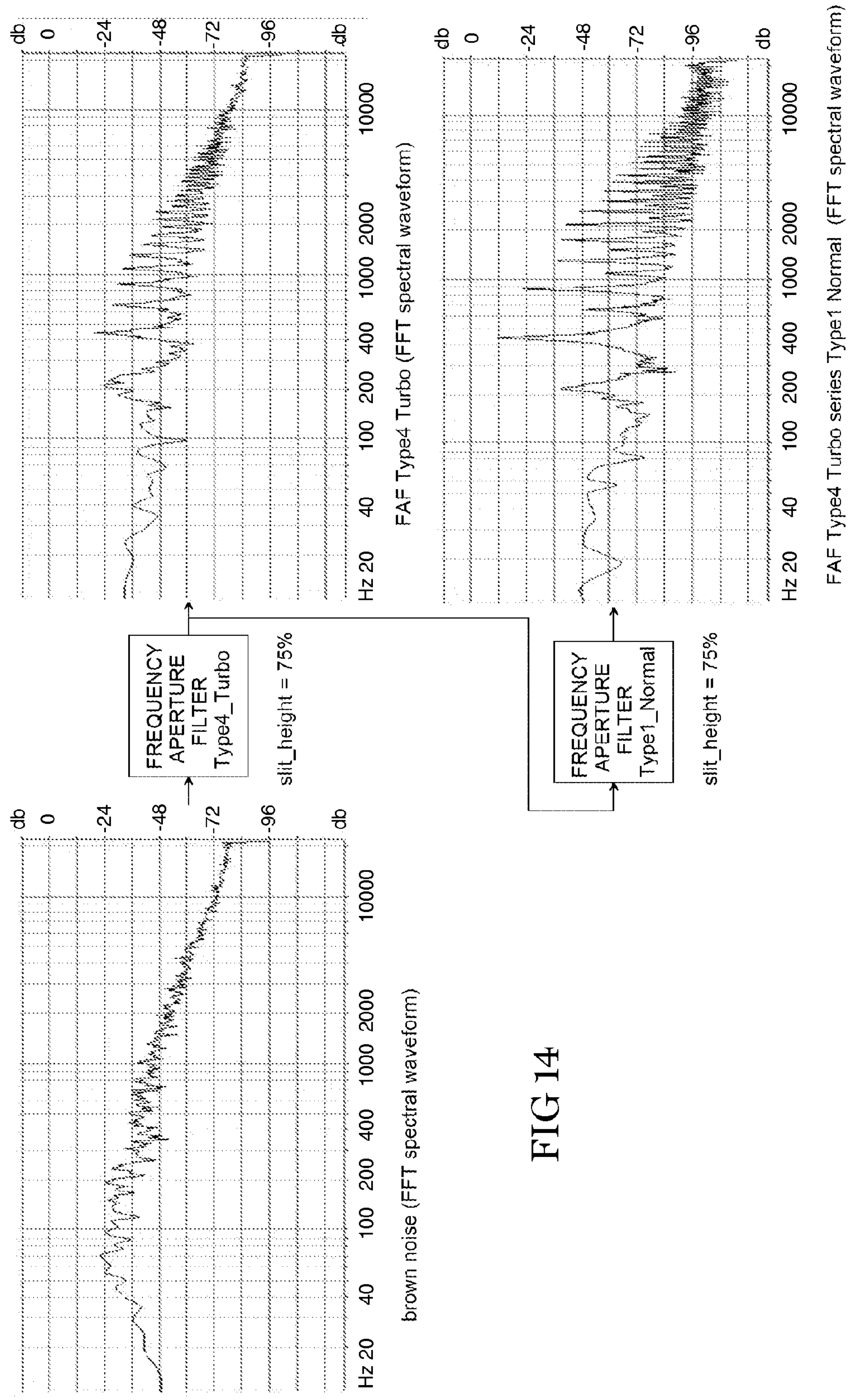
FIG. 14 illustrates a FFT spectral waveform graph view showing a series of waveforms in a 2-series-by-1-parallel array, including a waveform for audio input, waveforms for output from each FAC, and a final waveform for audio output in accordance with an embodiment.

FIG. 14 illustrates a FFT spectral waveform graph view showing a series of waveforms in a 2-series-by-1-parallel array, including a waveform for audio input, waveforms for output from each FAC, and a final waveform for audio output in accordance with an embodiment. In this series of waveforms, the input source is brown noise. After processing through the first FAF (of Type4_turbo), the resultant waveform is shown. After processing through a second FAF (of Type1_normal), the final waveform is shown. This exemplifies processing of audio signals through a series of frequency aperture filters.

Figure 15:
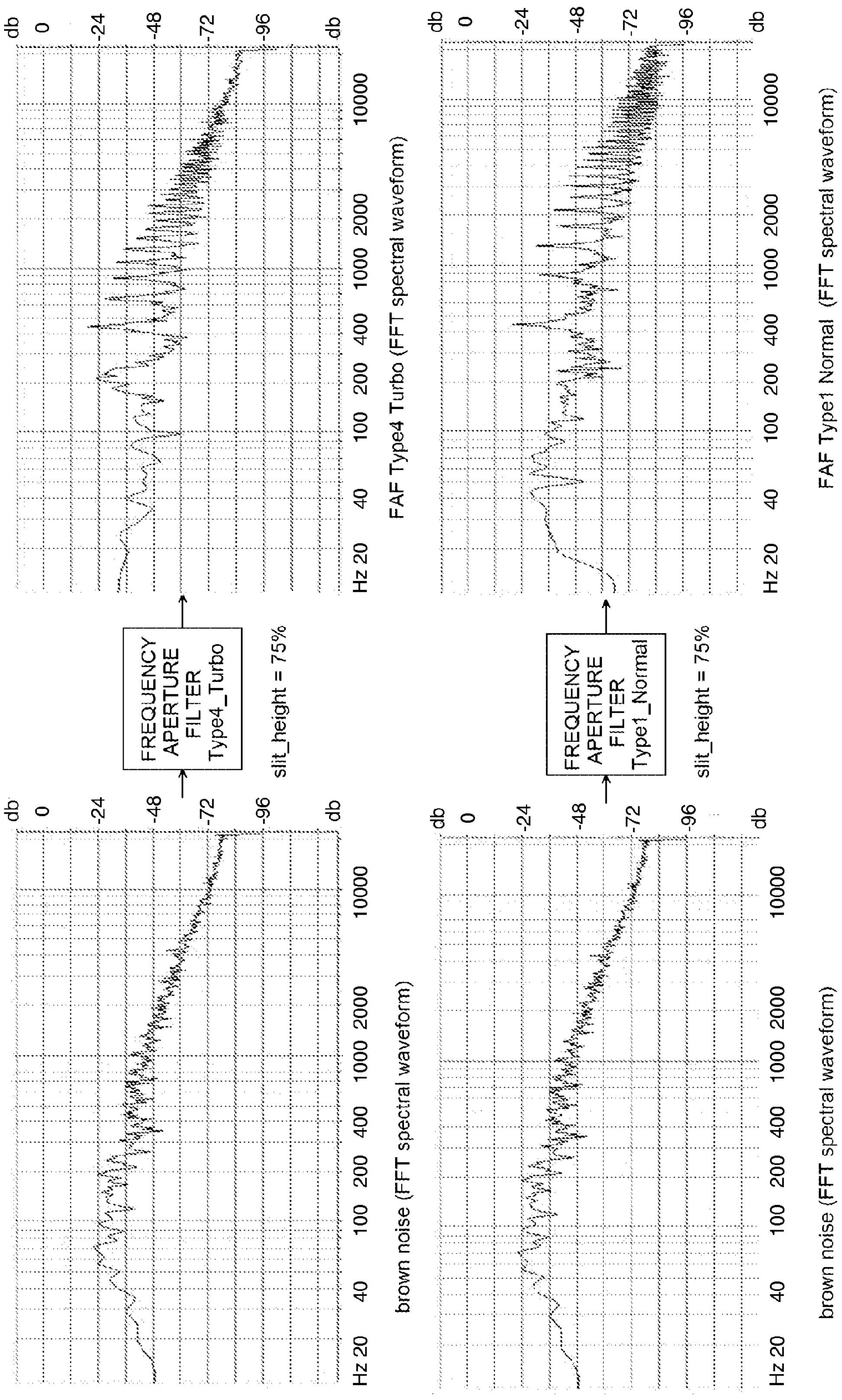
FIG. 15 illustrates a FFT spectral waveform graph view showing a series of waveforms in a 1-series-by-2-parallel array, including identical waveforms for audio input, waveforms for output from each FAC, each processed separately with a different FAF Type, and each showing different final waveforms for audio output in accordance with an embodiment.
Figure 16:
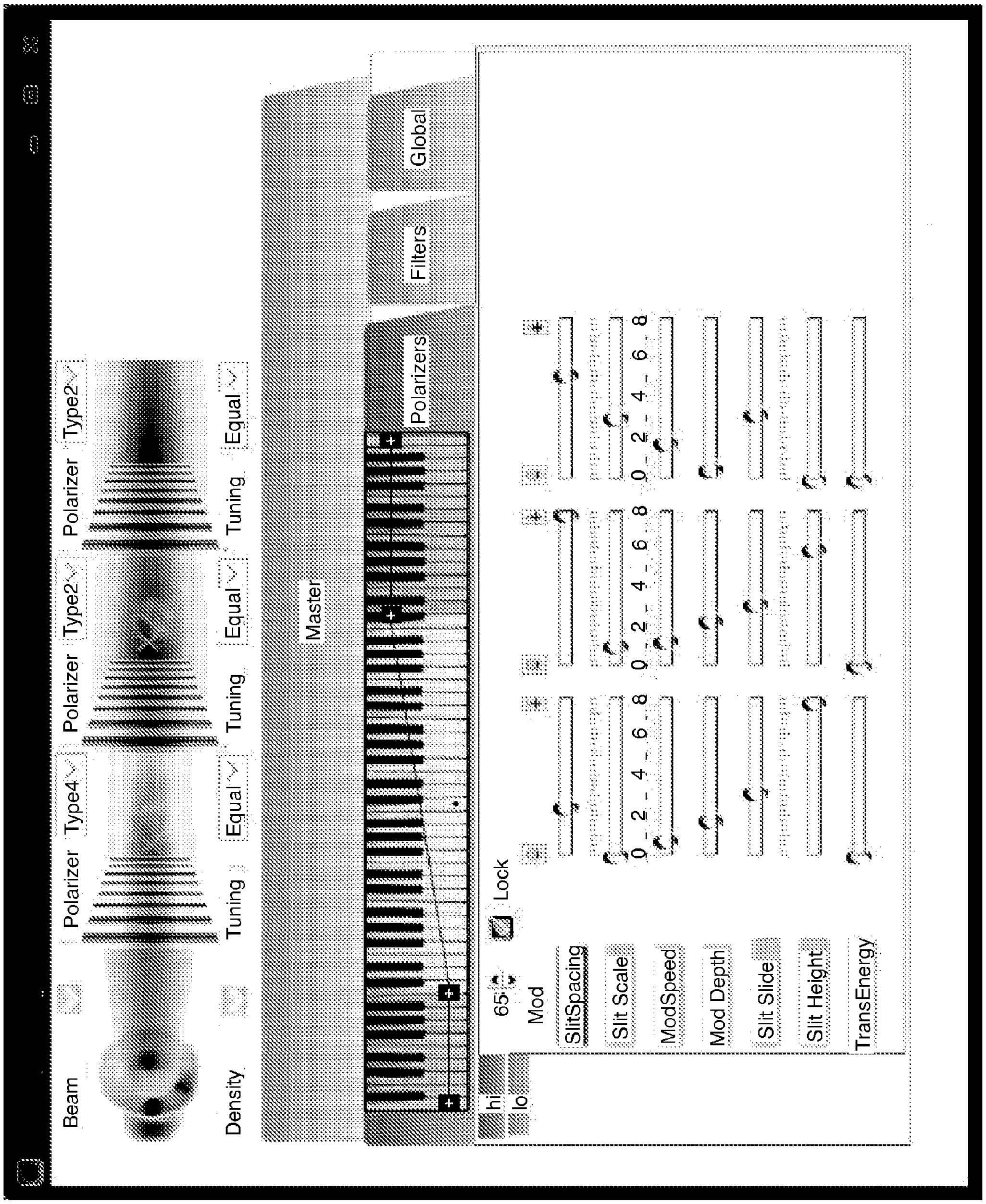
FIGS. 16, 17, 18, 19, and 20 illustrate a series of computer screenshot views showing user controls to select parameters, such as slit_height, slit_width and other pre-sets, for use or initialization in the FACs in accordance with an embodiment.
Figure 17:
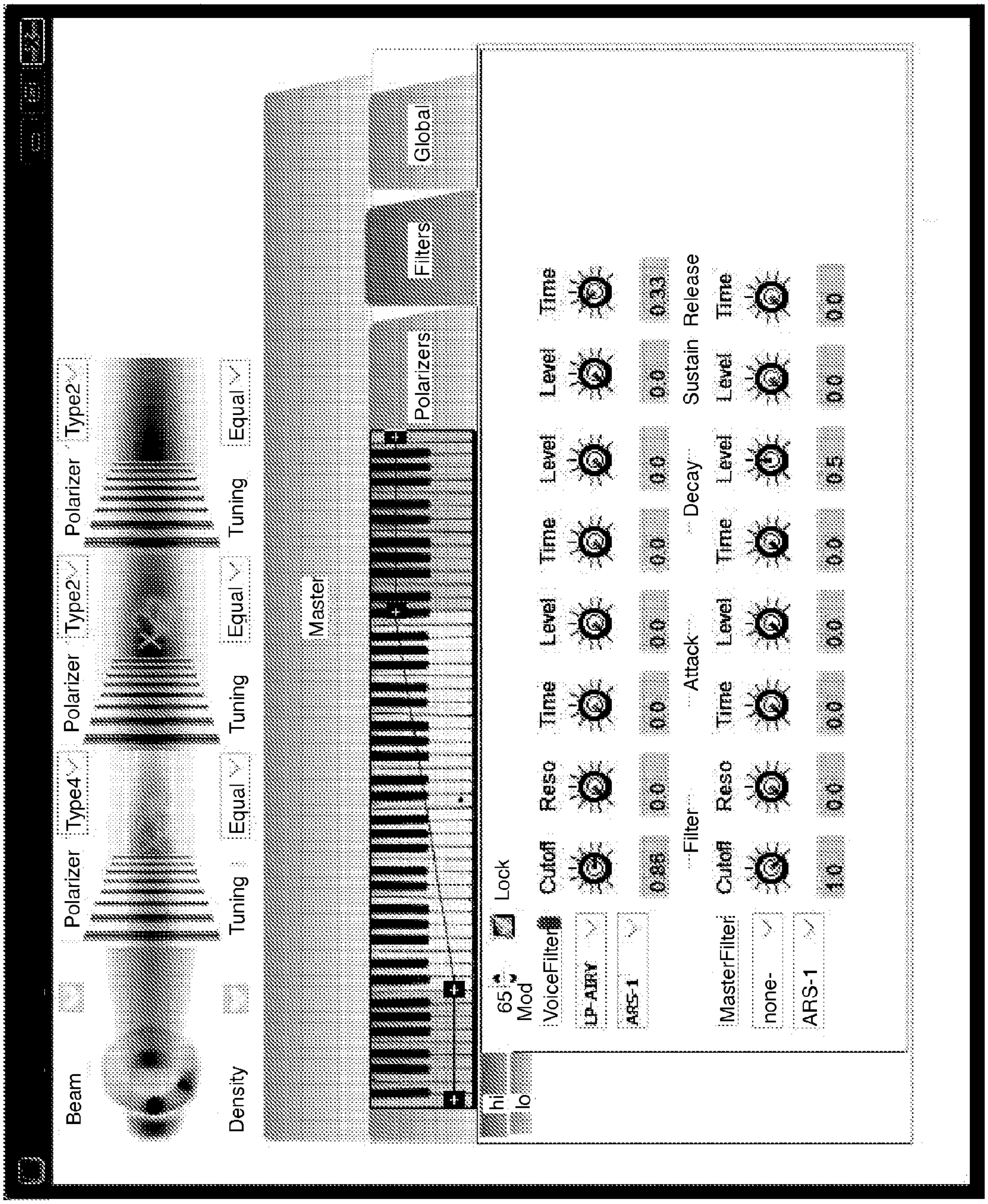
Figure 18:
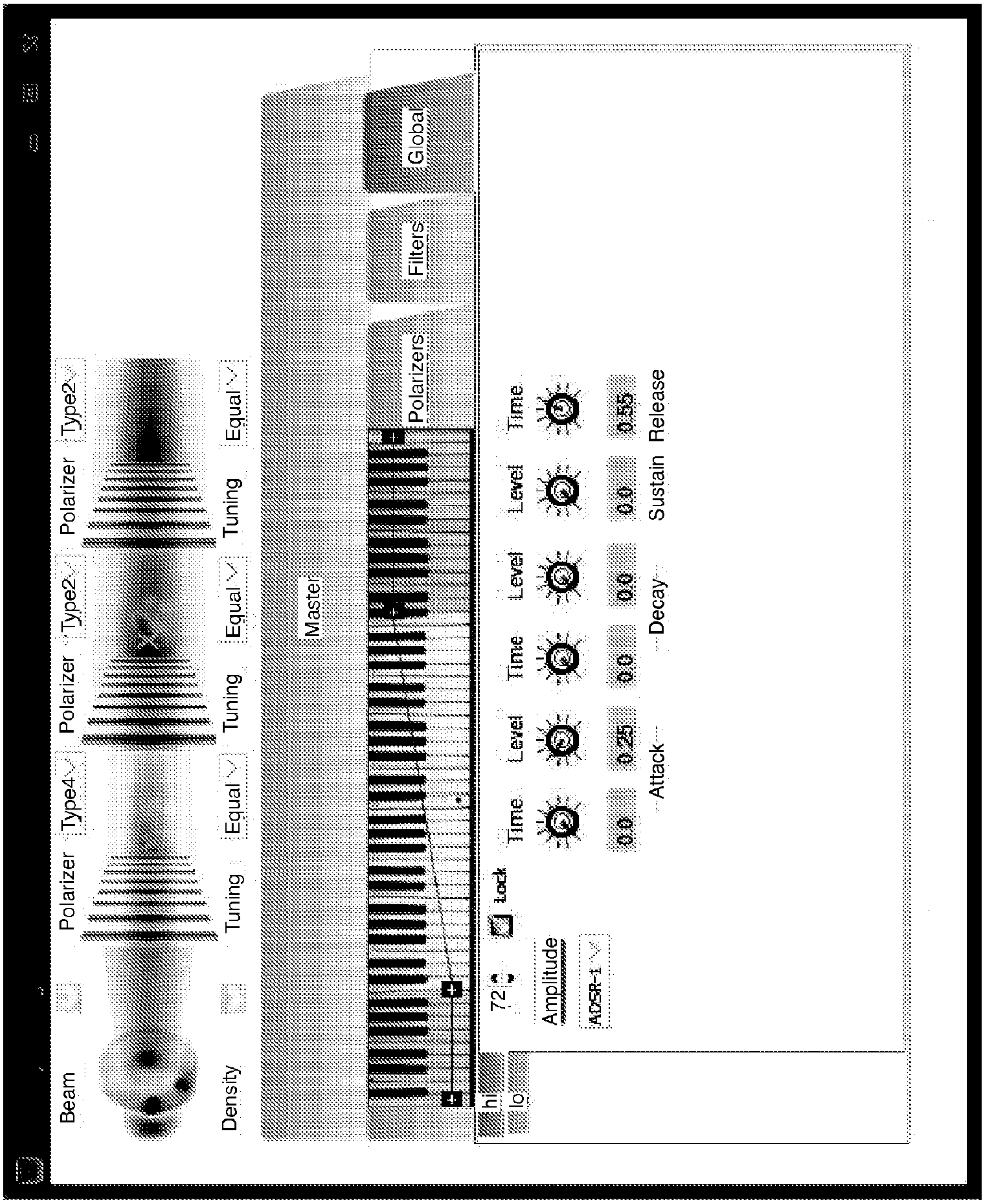
Figure 19:
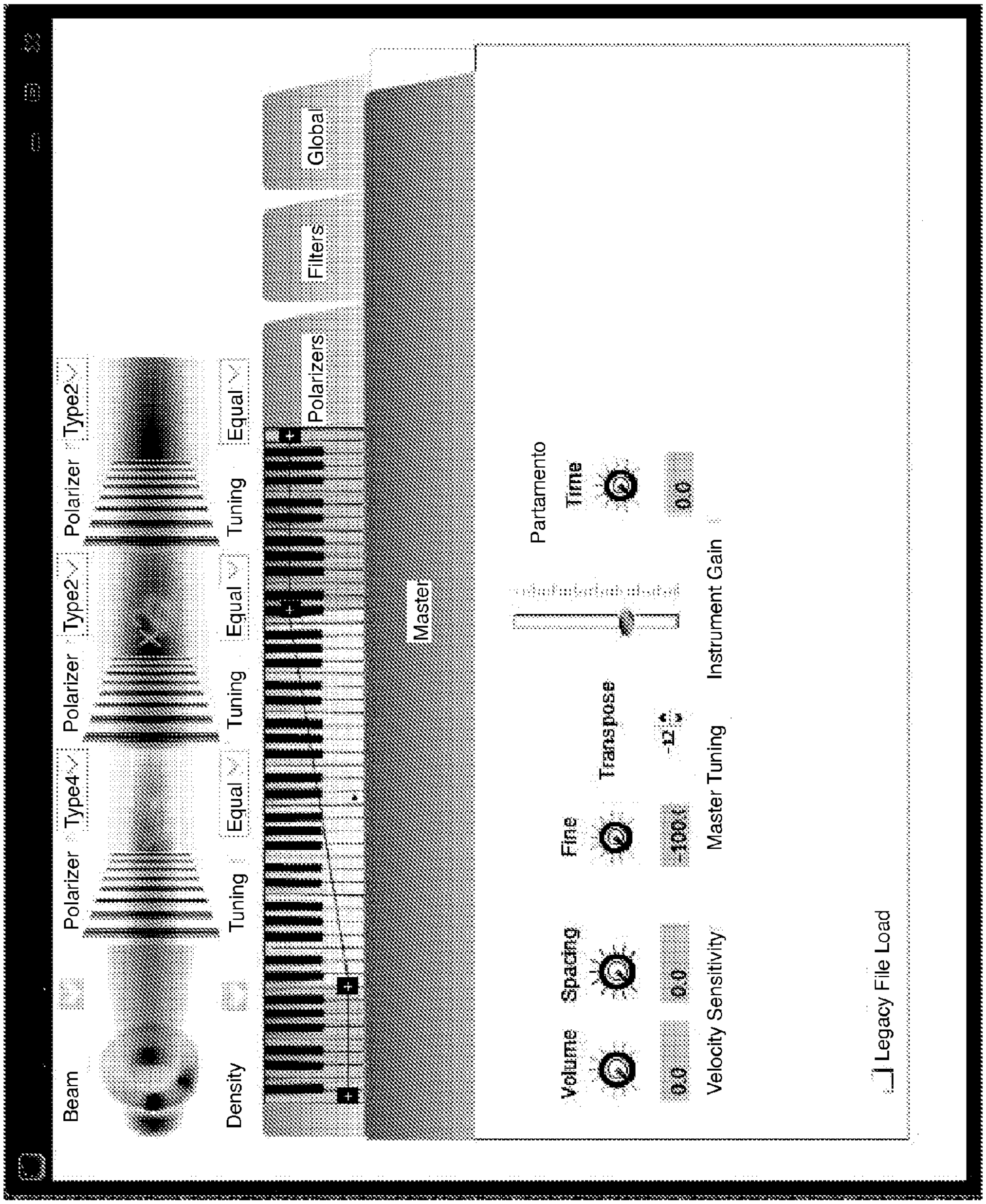
Figure 20:
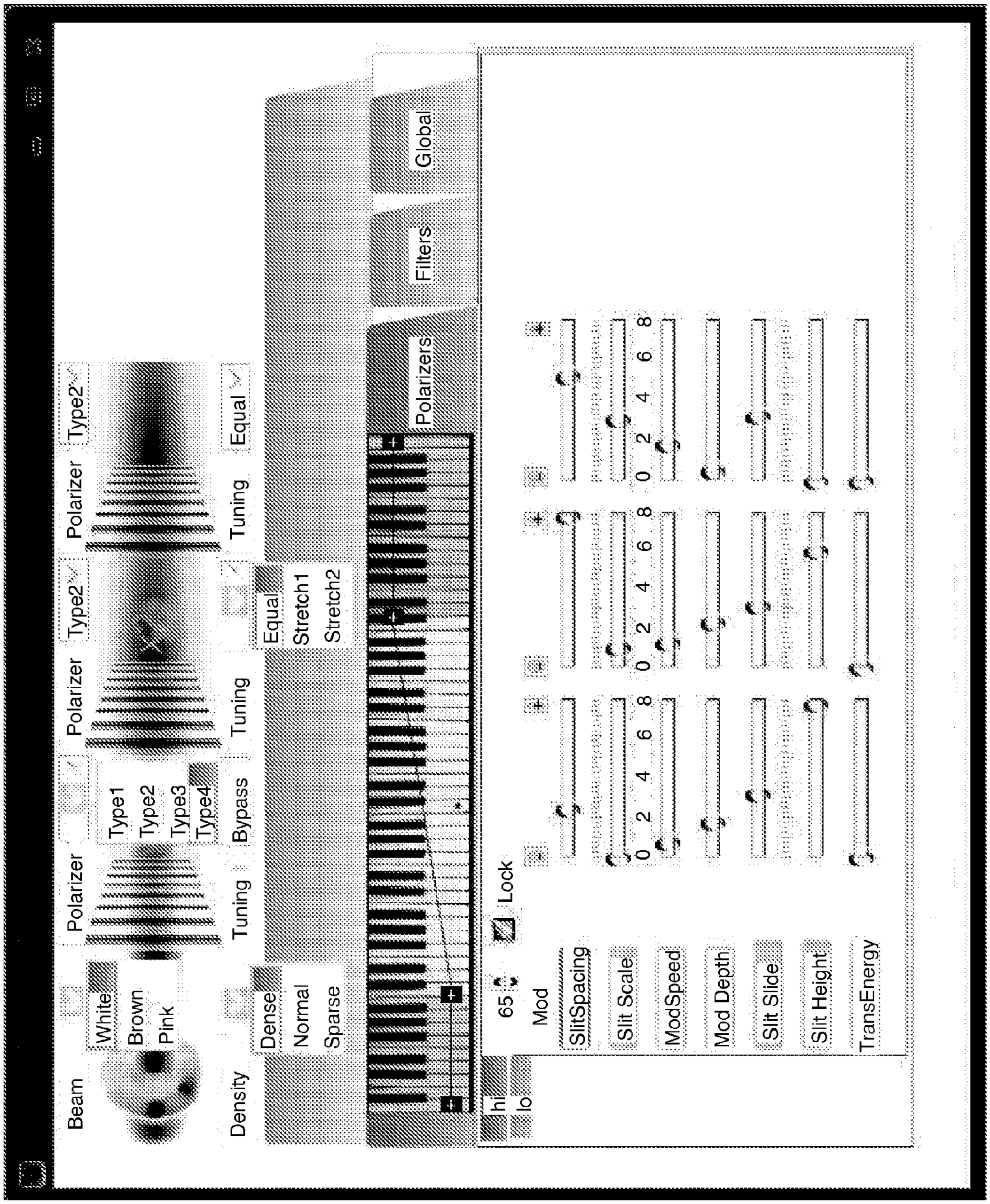

FIG. 15 illustrates a FFT spectral waveform graph view showing a series of waveforms in a 1-series-by-2-parallel array, including identical waveforms for audio input, waveforms for output from each FAC, each processed separately with a different FAF Type, and each showing different final waveforms for audio output in accordance with an embodiment. These waveform graphs show the differences in filter types, given the same waveform input.

FIGS. 16, 17, 18, 19, and 20 illustrate a series of computer screenshot views showing user controls to select parameters, such as slit_height, slit_width and other pre-sets, for use or initialization in the FACs in accordance with an embodiment. This screenshots show how the user of computer software can set the slit_width, slit_height, number and type of frequency aperture cells, and other pre-sets to produce synthesized audio. The slit_width (i.e. the desired frequency slit spacing) and the slit_height (i.e. desired noise-to-frequency band ratio) may be selected to produce a specific tibre or other musical quality. Then during filter, the series of frequency-bands-with-noise will be generated to conform to the selection.

Appendix A lists sets of parameters and other pre-sets to produce various example timbres in accordance with an embodiment. These parameters and pre-sets may be available to the user of a computer or displayed on screens such as those shown in FIGS. 16, 17, 18, 19 and 20.

The above-described systems and methods can be used in accordance with various embodiments to provide a number of different applications, including but not limited to:

A system and method that can synthesize pitched, musical sounds from non-pitched, broad-spectrum audio.

A system and method of combining and arranging frequency aperture cells for extreme efficiency of processing and memory.

A system and method of transforming audio with discernible pitch and timbre into broad-spectrum noise with no discernible pitch and timbre.

A system and method for combining the above synthesis with other synthesis methods to create hybrid synthesizers.

A system and method for modulating individual components of the system using MIDI, algorithmic or physical controllers.

A system and method for using real-time, streamed audio as an input audio source for the above synthesizer.

A system and method for vocalizing into the above synthesizer while playing MIDI and having the vocalization re-pitched and harmonized.

A system and method for inputting any musical audio source, whether file-based or streamed, and re-pitching it and re-harmonizing.

A system and method for vocalizing into the above synthesizer while playing MIDI and having the synthesizer play a recognizable musical instrument.

The present invention may be conveniently implemented using one or more conventional general purpose or specialized digital computers or microprocessors programmed according to the teachings of the present disclosure. Appropriate software coding can readily be prepared by skilled programmers based on the teachings of the present disclosure, as will be apparent to those skilled in the software art.

In some embodiments, the present invention includes a computer program product which is a storage medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

There are a total of 17 source code files incorporated by reference to an earlier application. Further, many other advantages of applicant's invention will be apparent to those skilled in the art from the computer software source code and included screen shots.

A portion of the disclosure of this patent document contains material which is subject to copyright protection; i.e. Copyright 2010 James Van Buskirk (17 U.S.C. 401). The copyright owner has no objection to the facsimile reproduction by anyone of the patent document or the patent disclosure, as it appears in the Patent and Trademark Office patent file or records, but otherwise reserves all copyright rights whatsoever.

The foregoing description of the present invention has been provided for the purposes of illustration and description. It is not intended to be exhaustive or to limit the invention to the precise forms disclosed. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A method for synthesizing audio to produce a musical sound, comprising the steps of:

inputting an audio source;

setting parameters to specify the desired frequency slit spacing and the desired noise-to-frequency-band ratio;

filtering the audio source through at least one sequence of at least two filters to filter the audio source into a series of frequency-bands-with-noise;

during the step of filtering, conforming the series of frequency-bands-with noise to the parameters to produce the desired frequency slit spacing and the desired noise-to-frequency-band ratio;

wherein input to the first filter is the audio source, and the input to a subsequent filter is the output of the previous filter, whereby the last filter produces audio output; and outputting audio output to produce the musical sound, wherein the audio source comprises non-pitched, broad-spectrum audio with no discernible pitch and timbre, and the audio output comprises pitched, musical sounds with discernible pitch and timbre.

2. The method of claim 1 further comprising the step of:

varying the parameters between the filters in the sequence.

3. The method of claim 1 further comprising the step of:

modulating, the output of at least one of the filters in the sequence using the output of another filter in the sequence.

4. The method of claim 1 further comprising the step of:

modulating the output of at least one of the filters in the sequence using a modulator selected from the group consisting of low frequency oscillator modulator, random generator modulator, envelop modulator, and MIDI control modulator.

5. The method of claim 1 further comprising the step of:

multimode-filtering the output of each filter in the sequence using a multimode filter selected from the group consisting of lowpass filter, highpass filter, bandpass filter, and bandreject filter.

6. The method of claim 1 wherein:

the step of filtering includes at least two sequences of filters; and modulating the output of filters in one sequence using the output of at least one filter from another sequence.

7. The method of claim 6 wherein:

the step of filtering includes at least three filters in each sequence.

8. The method of claim 1 wherein:

the filter comprises an additive type filter.

9. The method of claim 1 wherein:

the filter comprises a subtractive type filter.

10. The method of claim 1 wherein:

the filter comprises a finite impulse response type filter.

11. The method of claim 1 wherein:

the filter comprises an infinite impulse response type filter.

12. The method of claim 1 wherein:

the audio source comprises a musical audio source; and the audio output comprises the musical audio source re-pitched and harmonized.

13. The method of claim 1 further comprising the steps of:

varying the parameters between the fitters in the sequence;

modulating the output of at least one of the filters in the sequence using the output of another filter in the sequence; and multimode-filtering the output of each filter in the sequence using a multimode-filter selected from the group consisting of lowpass filter, highpass filter, bandpass filter, and bandreject filter.

14. A method for synthesizing audio to produce a musical sound, comprising the steps of:

receiving an audio source;

filtering the audio source through a first filter to filter the audio source into a series of frequency-bands-with-noise;

suppressing high energy bands to increase feedback in the series of frequency-bands-with-noise;

re-filtering the series of frequency-bands-with-noise having suppressed high energy bands through a second filter; and outputting the series of frequency-bands-with-noise as audio output to produce musical sound, wherein the audio source comprises non-pitched, broad-spectrum audio with no discernible pitch and timbre, and the audio output comprises pitched, musical sounds with discernible pitch and timbre.

15. The method of claim 14 further comprising the steps of:

setting first parameters to specify the desired frequency slit spacing and the desired noise-to-frequency-band ratio; and during the step of filtering, conforming the series of frequency-bands-with noise to the first parameters.

16. The method of claim 15 further comprising the steps of:

setting second parameters to specify the desired frequency slit spacing and the desired noise-to-frequency-band ratio; and during the step of re-filtering, conforming the series of frequency-bands-with noise to the second parameters.

17. The method of claim 16 further comprising the steps of:

calculating, between the step of filtering and re-filtering, the second parameters and at least one co-efficient of the filter to prevent passing of unity gain.

18. The method of claim 17 wherein:

the step of calculating uses the first parameters and at least one key tracker.

19. The method of claim 17 wherein:

the step of calculating uses the first parameters and at least one key tracker to determine a desired amount of noise-to-feedback ratio.

20. The method of claim 17 wherein:

the step of calculating uses the first parameters and at least one key tracker to determine a desired amount of frequency slit spacing.

21. The method of claim 14 further comprising the steps of:

selecting first parameters to specify the desired frequency slit spacing and the desired noise-to-frequency-band ratio;

during the step of filtering, conforming the series of frequency-bands-with noise to the first parameters;

selecting second parameters to specify the desired frequency slit spacing and the desired noise-to-frequency-band ratio;

calculating, between the step of filtering and re-filtering, the second parameters, at least one co-efficient of the filter to prevent passing of unity gain; wherein the step of calculating uses the first parameters and at least one key tracker to determine a desired amount of noise-to-feedback ratio; and during the step of re-filtering, conforming the series of frequency-bands-with noise to the second parameters.

22. A method for synthesizing audio to produce a musical sound, comprising the steps of:

receiving an audio source;

accepting parameters to specify the desired frequency slit spacing and the desired noise-to-frequency-band ratio;

filtering the audio source through at least one sequence of at least two filters to filter the audio source into a series of frequency-bands-with-noise with the desired frequency slit spacing and the desired noise-to-frequency-band ratio;

suppressing, between each filter in the sequence, high energy bands to increase feedback in the series of frequency-bands-with-noise;

modulating, between each filter in the sequence, the output of at least one of the filters in the sequence using the output of another filter in the sequence;

calculating, between each filter in the sequence, the parameters and at least one co-efficient of the filter to prevent passing of unity gain; and outputting audio output to produce musical sound.

23. The method of claim 22 further comprising the steps of:

providing a set of pre-sets to produce a musical timbre; and pre-loading the filter with the pre-set.

24. The method of claim 22 further comprising the steps of:

reading and writing the audio source from a circular ram buffer.

* * * * *